(12) United States Patent  
Li et al.

(10) Patent No.: US 7,989,800 B2
(45) Date of Patent: Aug. 2, 2011

(54) NANOWIRE FIELD EFFECT JUNCTION DIODE

(75) Inventors: Qiliang Li, Fairfax, VA (US); Dimitris E. Ioannou, Fairfax, VA (US); Yang Yang, Fairfax, VA (US); Xiaoxiao Zhu, Fairfax, VA (US)

(73) Assignee: George Mason Intellectual Properties, Inc., Fairfax, VA (US)

( * ) Notice: Subject to any disclaimer, the term of this patent is extended or adjusted under 35 U.S.C. 154(b) by 97 days.

(21) Appl. No.: 12/578,676

(22) Filed: Oct. 14, 2009

(65) Prior Publication Data

US 2010/0090198 A1   Apr. 15, 2010

Related U.S. Application Data

(60) Provisional application No. 61/105,180, filed on Oct. 14, 2008.

(51) Int. Cl.
  *H01L 31/09*  (2006.01)
(52) U.S. Cl. .................. 257/24; 257/E31.093; 977/762; 977/938
(58) Field of Classification Search .................. 257/24, 257/E31.093; 977/762, 938
See application file for complete search history.

(56) References Cited

U.S. PATENT DOCUMENTS

2009/0050876 A1*   2/2009   Marks et al. ................... 257/24

OTHER PUBLICATIONS

Y. Chun. et al., "High-performance metal-induced lateral-cyrstallization polisilicon thin-film transistors with multiple nanowire channels and mulitiple gates" IEEE trans. on NANO. Tech. vol. 5, No. 3, p. 157-162, 2006.*

* cited by examiner

*Primary Examiner* — Thanh V Pham
*Assistant Examiner* — Mark A Laurenzi, III
(74) *Attorney, Agent, or Firm* — David Grossman

(57) ABSTRACT

A nanowire field effect junction diode constructed on an insulating transparent substrate that allows form(s) of radiation such as visual light, ultraviolet radiation; or infrared radiation to pass. A nanowire is disposed on the insulating transparent substrate. An anode is connected to a first end of the nanowire and a cathode is connected to the second end of the nanowire. An oxide layer covers the nanowire. A first conducting gate is disposed on top of the oxide layer adjacent with a non-zero separation to the anode. A second conducting gate is disposed on top of the oxide layer adjacent with a non-zero separation to the cathode and adjacent with a non-zero separation the first conducting gate. A controllable PN junction may be dynamically formed along the nanowire channel by applying opposite gate voltages. Radiation striking the nanowire through the substrate creates a current the anode and cathode.

21 Claims, 19 Drawing Sheets

US 7,989,800 B2

NANOWIRE FIELD EFFECT JUNCTION DIODE

CROSS-REFERENCE TO RELATED APPLICATIONS

This application claims the benefit of U.S. Provisional Application No. 61/105,180, filed Oct. 14, 2008, entitled "Nanowire Field Effect Junction photovoltaic Sensors and Solar Cells," which is hereby incorporated by reference in its entirety.

DETAILED DESCRIPTION OF EMBODIMENTS

An embodiment of the present invention is a novel silicon nanowire field effect junction diode. This device may be used in photovoltaic devices and related applications. By tuning the two nearby gates with opposite voltage, a PN junction can be formed along an evenly doped (or un-doped) nanowire. These nanowire PN junction diodes can generate tunable open circuit voltage and AC voltage output under constant incident sunlight. Moreover, a large output voltage can be obtained by properly connecting the PN junctions in series. Due to the large surface-volume ratios and low-cost self-assembly, the nanowire field effect diode may be very attractive for applications such as, but not limited to, photovoltaic sensors, switches and solar cells.

Nanowires are quasi one-dimensional materials with diameters of approximately 1 to 100 nm with lengths varying from a few nano meters to hundreds of micro meters. Attractive properties of nanowires, nanoscale quantum confinement and large surface-volume ratios, make nanowires very promising candidates for application in optoelectronics. Recent studies have shown that nanowire can be used for photovoltaic devices. However, all of these reported nanowire photovoltaic devices have complicate structures and involve doping in nanoscale structures for the formation of PN junctions. The properties of semiconductor photovoltaic devices depend on the quality of PN junction(s). Generally, it is difficult to control the doping density and form a sharp PN junction in a nanoscale object like a nanowire. Very complicate processes (e.g., implantation on nanoscale objects) and advanced lithography may be needed to obtain a sharp nano scale PN junction, and thereby the advantage of low-cost self-assembly for nanowires may be difficult to achieve.

The presently discussed Si nanowire (SiNW) field effect diode (FED) embodiments may be used for various photovoltaic applications such as: (i) The PN junction of the SiNW FED can be formed and tuned robotically via controlling bias of the two nearby gates; (ii) With a gate-surrounding fully depletion channel, the SiNW FED can be operated efficiently with quick response, which is very attractive for applications in solar cells and photo detectors; (iii) Output voltage and current of the device can be tuned to a certain range of magnitude and phase; (iv) The FED can be engineered to construct an AC solar cell; and (v) Light can be detected by the polarization of output voltage and current which is different from the conventional optical sensors.

Device Structure and Operation Principles

Figure 1:
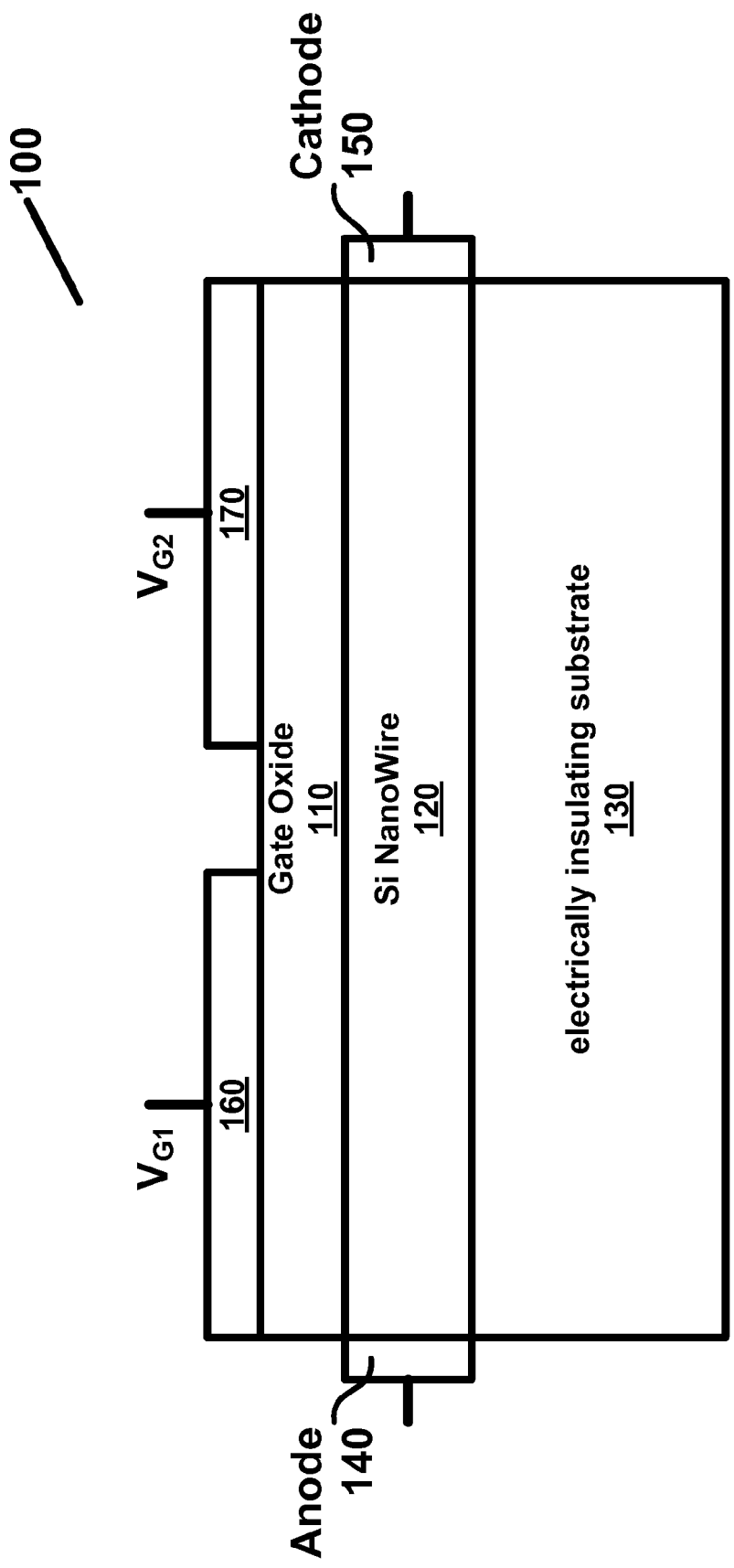
FIG. 1 is a schematic diagram a silicon nanowire field effect junction diode as per an aspect of an embodiment of the present invention.
Figure 12:
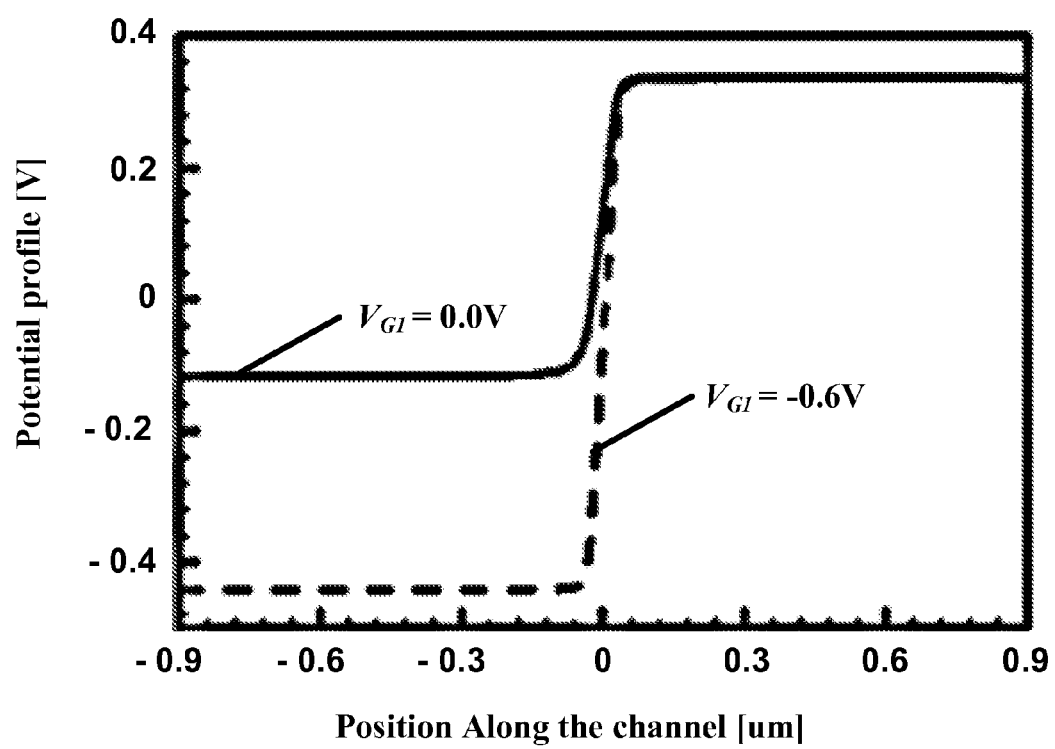
FIG. 12 is a graph showing the potential profile along a nanowire at different gate voltages as per an aspect of an embodiment of the present invention.

FIG. 1 is a schematic diagram a SiNW FED 100. The SiNW 120 may be lightly doped to p-type with an Ohmic contact (140 and 150) at the two ends. The nanowire 120 may be governed by two nearby gates (160 and 170) which induces positive or negative charges in the volume under each gate (160 and 170), and thereby make the part of nanowire 120 p-type or n-type, respectively. As a result, a high quality, controllable PN junction may be dynamically formed along the nanowire channel by applying opposite gate voltages. Due to the gate surrounding structure and nanoscale channel, the nanowire 120 may be efficiently converted to p or n regions. Larger positive and negative gate voltages induce n+ and p+ regions, respectively. In addition, the SiNW FED 100 may be prepared on an insulating transparent substrate such as a glass substrate 130 so that light can pass through the bottom substrate and be absorbed by the nanowire 120. As shown in a 2-dimensional potential vs. position simulation (see FIG. 12), different gate voltages induce different potential profiles in the SiNW 120, and thereby form a PN junction and a built-in potential ($V_{bi}$) along the SiNW 120. Specifically, FIG. 12 shows a potential profile along the nanowire (10 nm below the SiNW/SiO$_2$ interface) at different gate voltages; dashed line—$V_{G1}$=−0.6V and solid line—$V_{G1}$=0.0V. The built-in potential is modulated by the applied gate voltage. This built-in potential enables the separation of electron-hole pairs created by impinging photons and induced a photovoltaic current.

Figure 2:
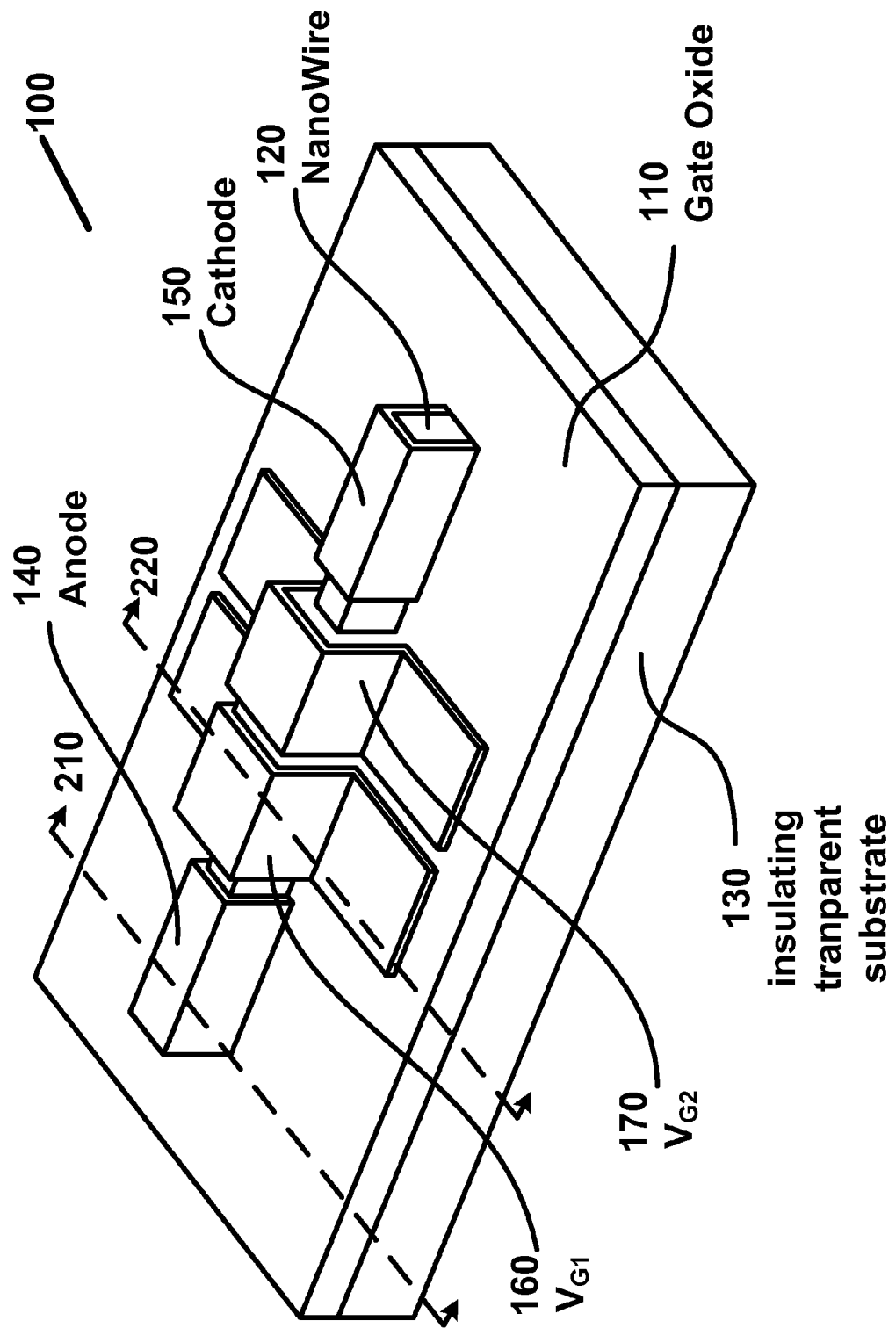
FIG. 2 shows a perspective view of a nanowire field effect junction diode according to an aspect of an embodiment of the invention.

FIG. 2 shows an embodiment of a nanowire field effect junction diode 100 according to an aspect of an embodiment of the invention. The nanowire field effect junction diode 100 may be constructed on an electrically insulating transparent substrate 130 enabling the nanowire field effect junction diode 100 to be configured to allow activating electromagnetic radiation to pass through the electrically insulating transparent substrate 130. The electrically insulating transparent substrate 130 may be selected to allow the passage of specified form(s) of radiation such as visual light, X-rays, ultraviolet radiation; infrared radiation or ultraviolet radiation. Clear insulating glass may be used as the insulating transparent substrate 130 when it is desired to pass visual light. Other materials may be used which have filtering characteristics to allow narrow ranges of wavelengths through. In other words, the nanowire field effect junction diode 100 may be adapted for frequency specific applications, both wideband and narrow band, through the selection of an insulating transparent substrate 130 with bandpass characteristics adapted to the application.

A nanowire 120 is disposed on the electrically insulating transparent substrate 130. The nanowire 120 may be approximately 1 to 50 nm in diameter. The nanowire 120 may be a semiconducting nanowire 120. Example materials that may be part of the semiconductor nanowire's 120 construction include, but are not limited to: Si, SiC, InP, GaN, and/or GaAs.

An oxide layer 110 covers the nanowire 120 creating a nanowire channel. The oxide layer may be constructed using any number of oxides as long as the voltage potential can pass through the oxide from the gate (160 or 170) to the nanowire 120 with a minimal attenuation. Examples of acceptable oxides include, but are not limited to, silicon oxides and metal oxides.

Figure 3:
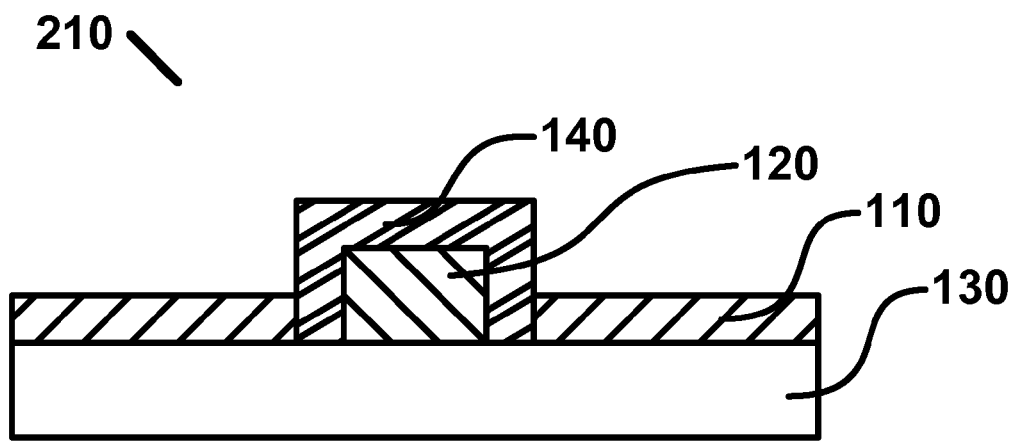
FIG. 3 shows a cross section of a nanowire field effect junction diode through an anode as per an aspect of an embodiment of the present invention.

An anode 140 is contacts a first end of the nanowire 120 and a cathode 150 contacts the second end of the nanowire 120. FIG. 3 shows a cross section 210 of a nanowire field effect junction diode 100 through anode 140 as per an aspect of an embodiment of the present invention. The Anode 140 may be made of a conducting material such as gold, copper, silver, aluminum or the like. The contact between the anode 140 and the nanowire 120 acts as a conductive electrical junction between the anode 140 and the nanowire 120. The anode 140 and cathode 150 are configured to act as an electrical connection point to each side of the nanowire 120. As shown in the embodiment of FIG. 3, the anode 140 contacts three sides of nanowire 120. However, one skilled in the art will recognize that the anode 140 or cathode 150 could be constructed to completely surround the nanowire 120 or to only contact some portion thereof as long as a viable junction between the nanowire 120 and the anode 140 or cathode 150 is created.

Figure 5:
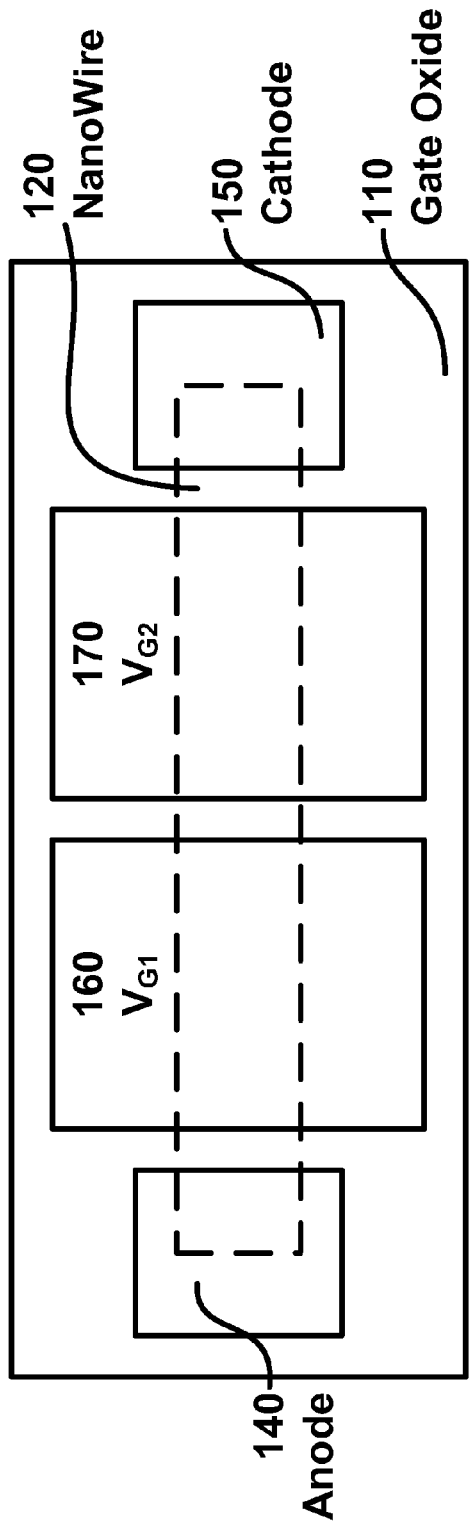
FIG. 5 shows a top down view of an embodiment where the anode and cathode are constructed on top of the gate oxide layer as per an aspect of an embodiment of the present invention.
Figure 6:
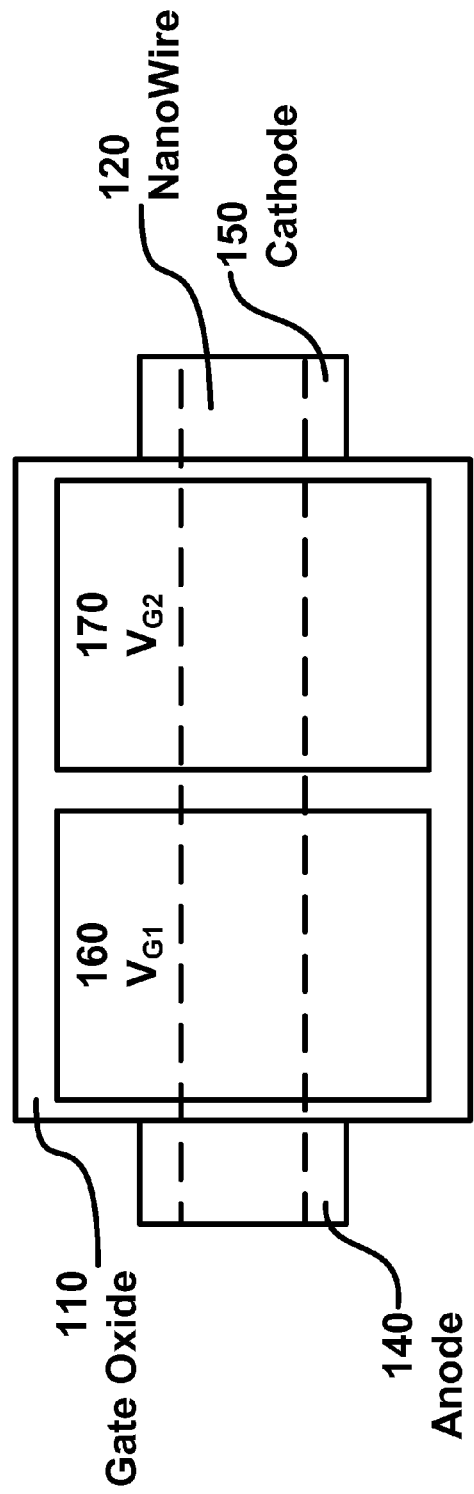
FIG. 6 is a top down view of an embodiment where the anode and cathode are constructed on the side of the gate oxide and insulating transparent substrate layers.

Also shown in FIG. 3 is the oxide layer 110 surrounding the anode 140. Again, one skilled in the art will recognize that the construction of this part of the nanowire field effect junction diode 100 may be modified as long as a viable junction between the nanowire 120 and the anode 140 or cathode 150 is created. For example, FIG. 5 shows a top down view of an embodiment where the anode 140 and cathode 150 are constructed such that they are surrounded by gate oxide 110. An alternative embodiment is shown in FIG. 6 which is a top down view of an embodiment where the anode 140 and cathode 150 are constructed on the side of the gate oxide 110 (and possible the insulating transparent substrate 130). These are only a few example constructions. One skilled in the art will recognize that many other constructions are possible within the limits of the present invention.

Figure 4:
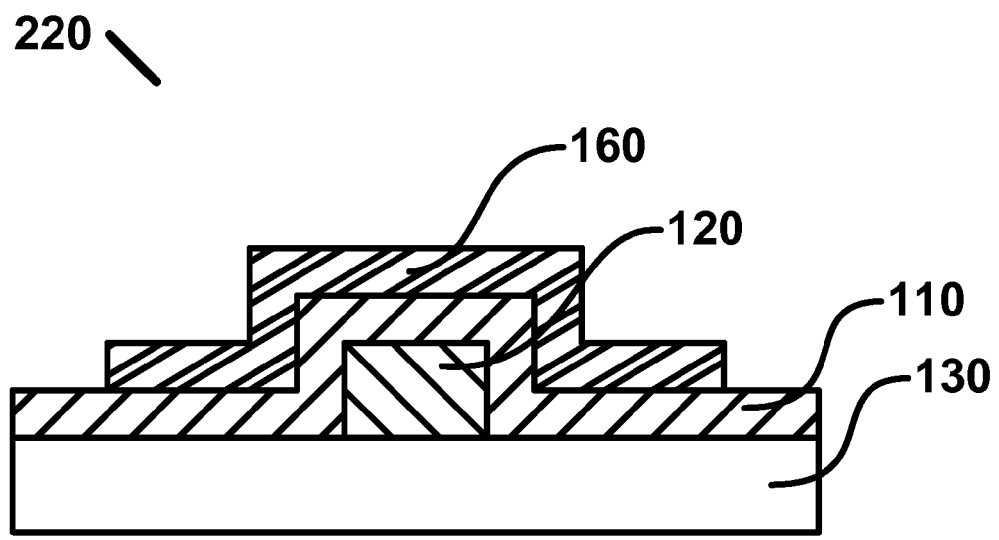
FIG. 4 shows a cross section of a nanowire field effect junction diode through a voltage gate as per an aspect of an embodiment of the present invention.

FIG. 4 shows a cross section 220 of a nanowire field effect junction diode 100 through $V_{G1}$ 160 as per an aspect of an embodiment of the present invention. The conducting gate 160 is disposed on top of the oxide layer 110 adjacent with a non-zero separation to the anode 140. As shown, one can see that the nanowire 120 is disposed on the transparent insulating substrate 130 in a nanowire channel created by the gate oxide 110 layer covering the nanowire 120. Similarly, a second conducting gate 170 is disposed on top of the oxide layer 110 adjacent with a non-zero separation to the cathode 150 and adjacent with a non-zero separation the first conducting gate 160. The $V_{G1}$ 160 (or $V_{G2}$ 170) may be made of a conducting material such as gold, copper, silver, aluminum or the like.

Figure 7:
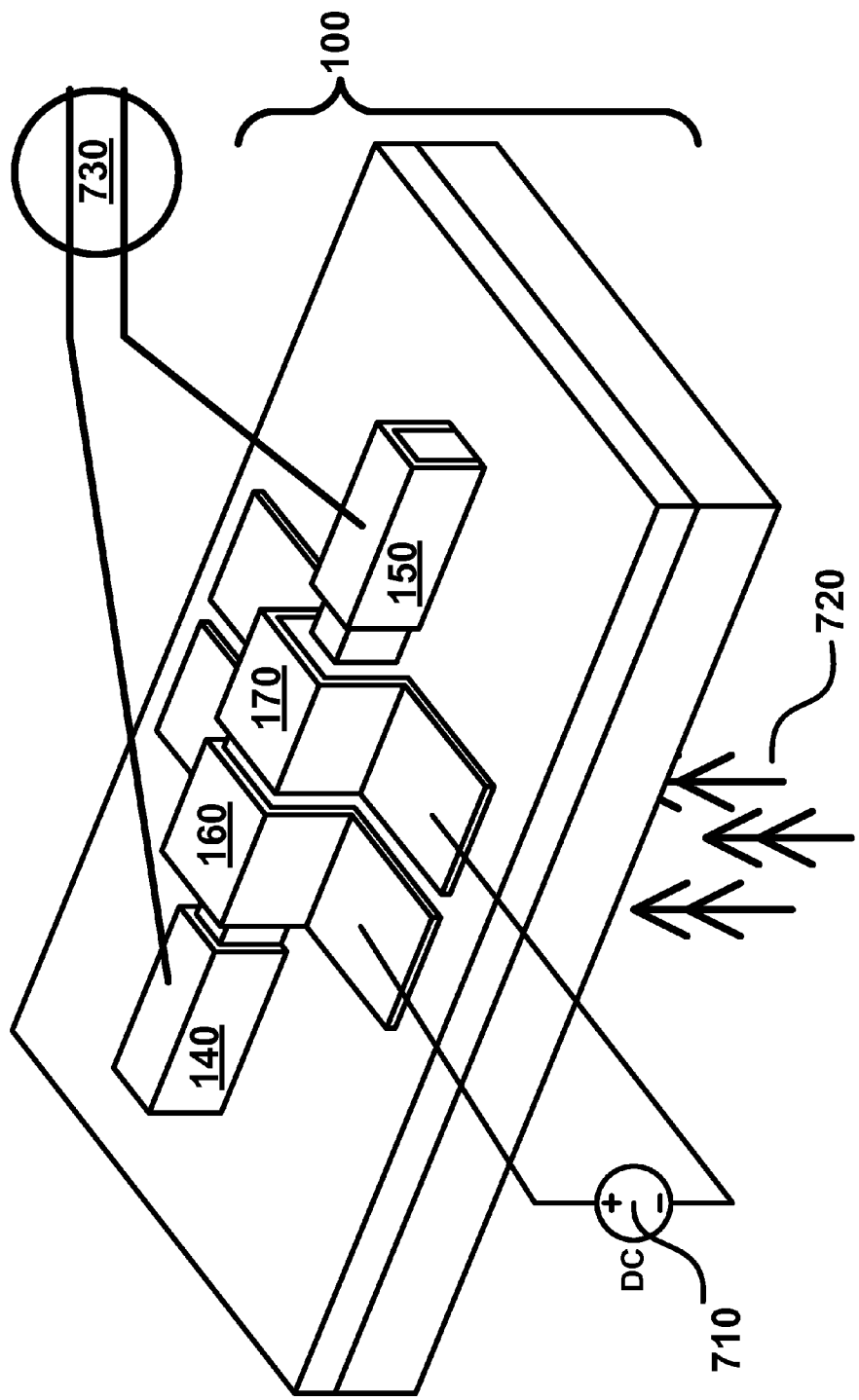
FIG. 7 shows a nanowire field effect junction diode configured with a DC bias voltage as per an aspect of an embodiment of the present invention.

FIG. 7 shows a nanowire field effect junction diode 100 configured with a DC bias voltage 710 applied across voltage gate 160 and voltage gate 170 and a power output receptacle 730 connected across anode 140 and cathode 150. This configuration should produce a DC voltage at 730 in response to radiation 720 applied to the nanowire through the electrically insulting transparent substrate 130.

Figure 8:
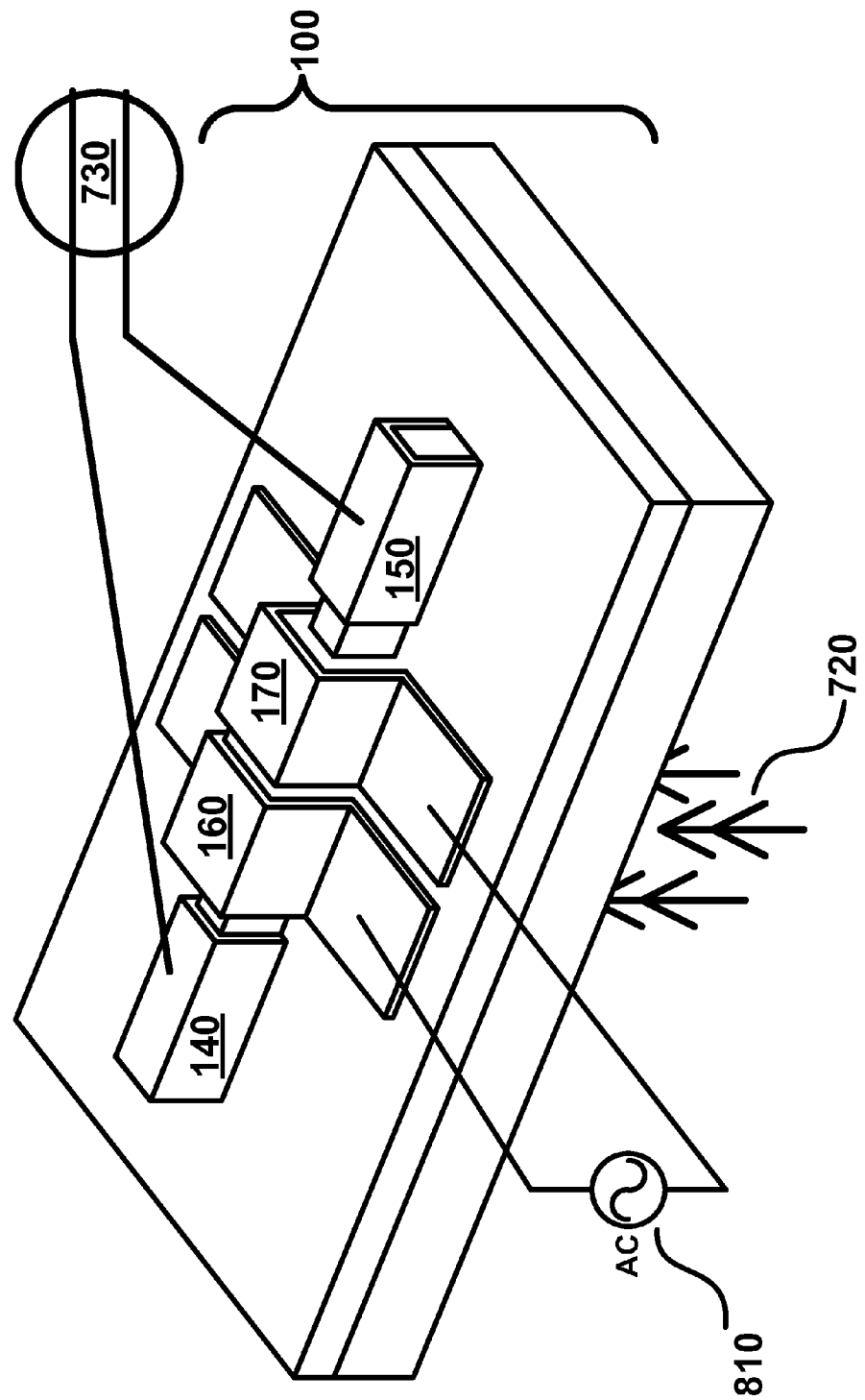
FIG. 8 shows a nanowire field effect junction diode configured with an AC bias voltage as per an aspect of an embodiment of the present invention.

Similarly, FIG. 8 shows a nanowire field effect junction diode 100 configured with an AC bias voltage 810 applied across voltage gate 160 and voltage gate 170 and a power output receptacle 730 connected across anode 140 and cathode 150. This configuration should produce an AC voltage at 730 that corresponds to the AC waveform generated by AC source 810 in response to radiation 720.

Figure 9:
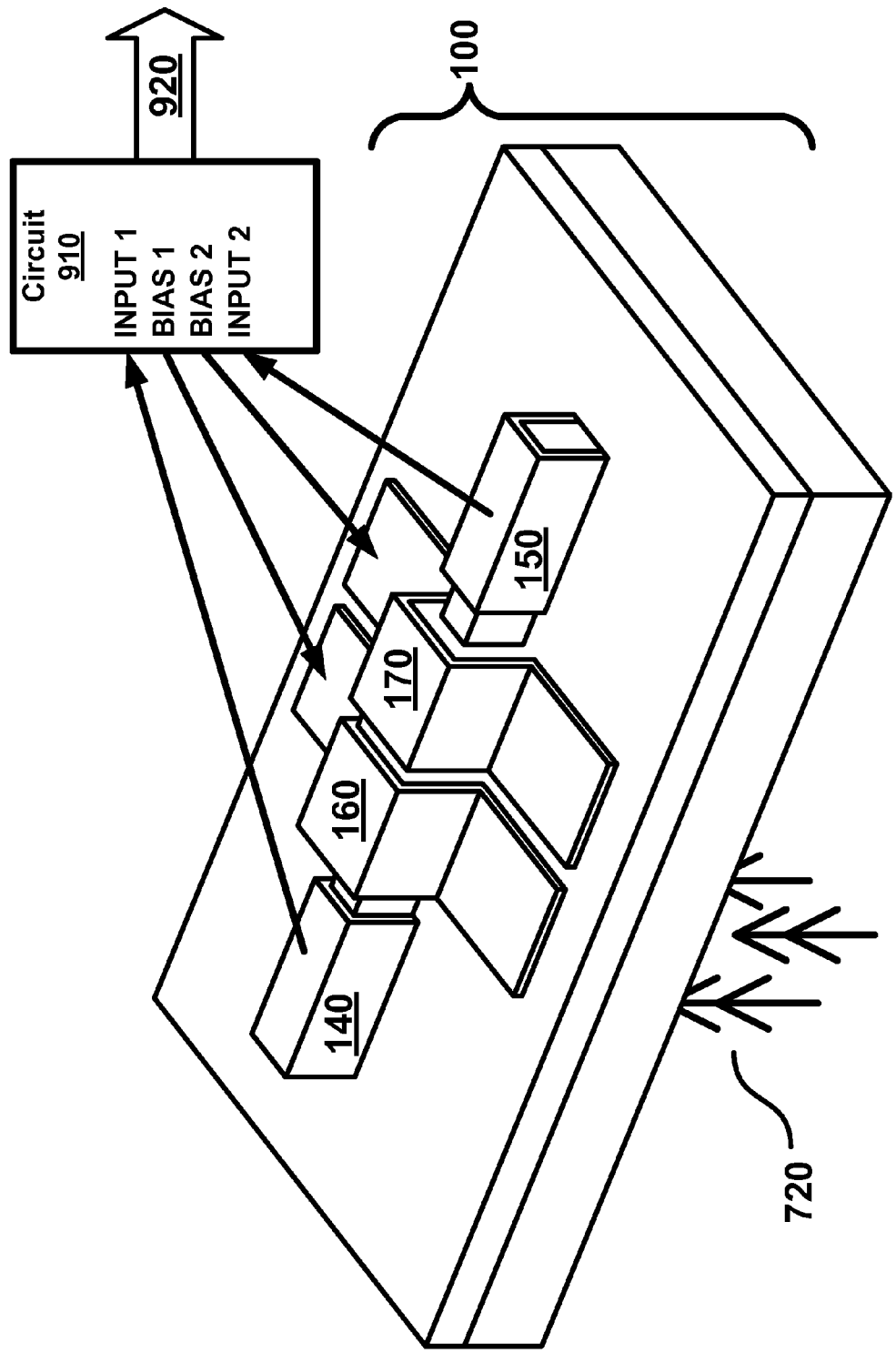
FIG. 9 shows a nanowire field effect junction diode connected to a circuit configured to react to changes in activating electromagnetic radiation as indicated by a voltage across the anode and cathode as per an aspect of an embodiment of the present invention.

FIG. 9 shows a nanowire field effect junction diode 100 connected to a circuit 910 configured to generate an output 920 in reaction to changes in activating electromagnetic radiation 720. As shown, the nanowire field effect junction diode 100 is configured to allow activating electromagnetic radiation 720 to pass through the electrically insulating transparent substrate 130. The first conducting gate 160 and second conducting gate 170 are biased with a bias voltage. Although this diagram shows the bias voltage to originate from the circuit 910, it may also originate from another source. The bias voltage may be a DC or AC voltage. The anode 140 is connected to a first terminal of a circuit 910 and the cathode 150 is connected to a second terminal of the circuit 910.

In some embodiments, the circuit 910 may react to changes in activating electromagnetic radiation 720 as indicated by a voltage across the anode 140 and cathode 150. In yet other embodiments, the circuit 910 may react to changes in activating electromagnetic radiation 720 as indicated by a current passing through the anode 140 and cathode 150. In yet further embodiments, the circuit may react to changes in activating electromagnetic radiation 720 as indicated by polarity changes in the voltage across the anode 140 and cathode 150. One skilled in the art will recognize that other indications may also be used by the circuit 910 such as power produced by the nanowire field effect junction diode 100. The output 920 may be a power output, a control output signal or display indicator or a combination thereof.

Figure 10:
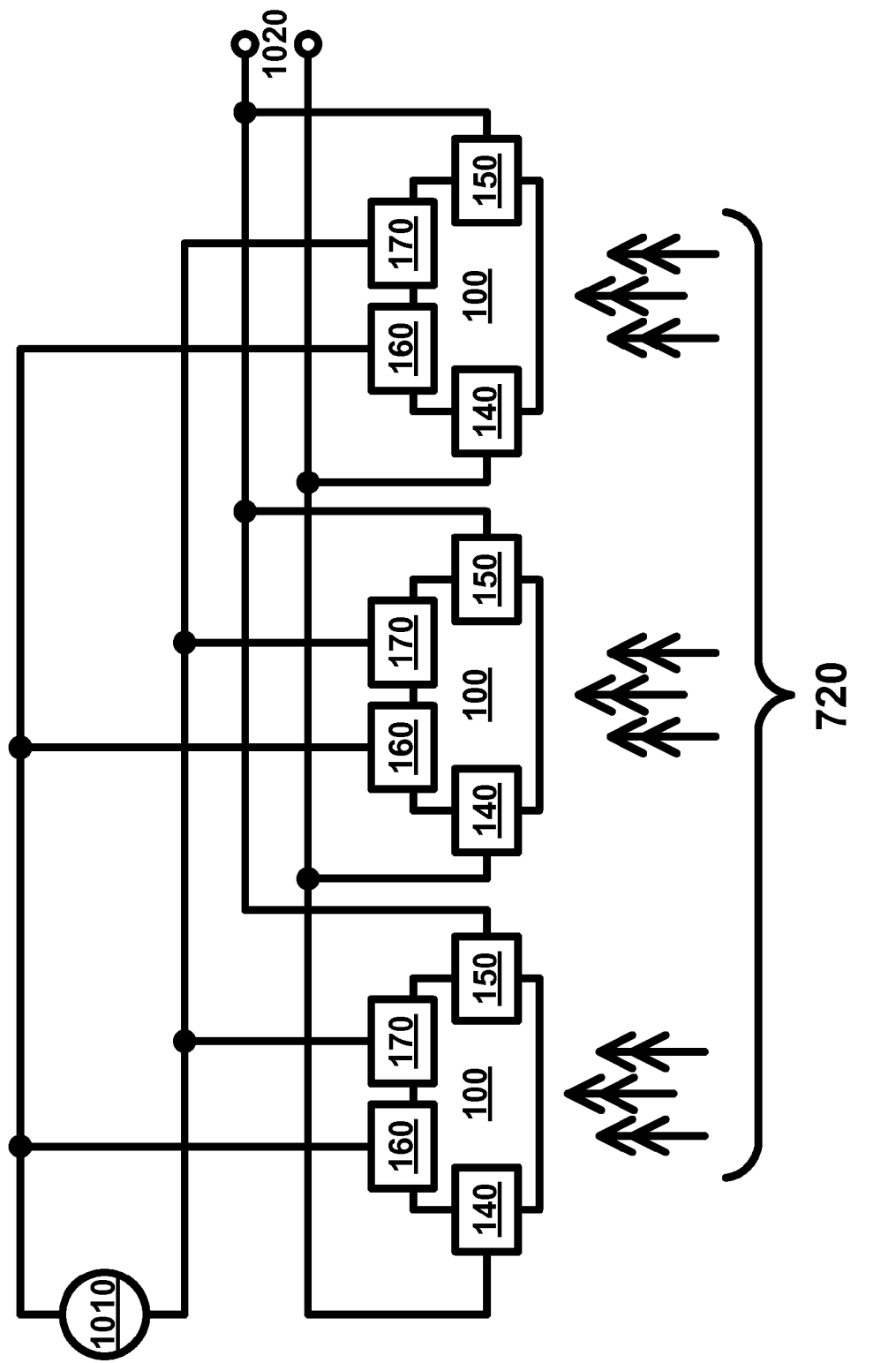
FIG. 10 shows a multitude of nanowire field effect junction diodes connected in parallel as per an aspect of an embodiment of the present invention.
Figure 11:
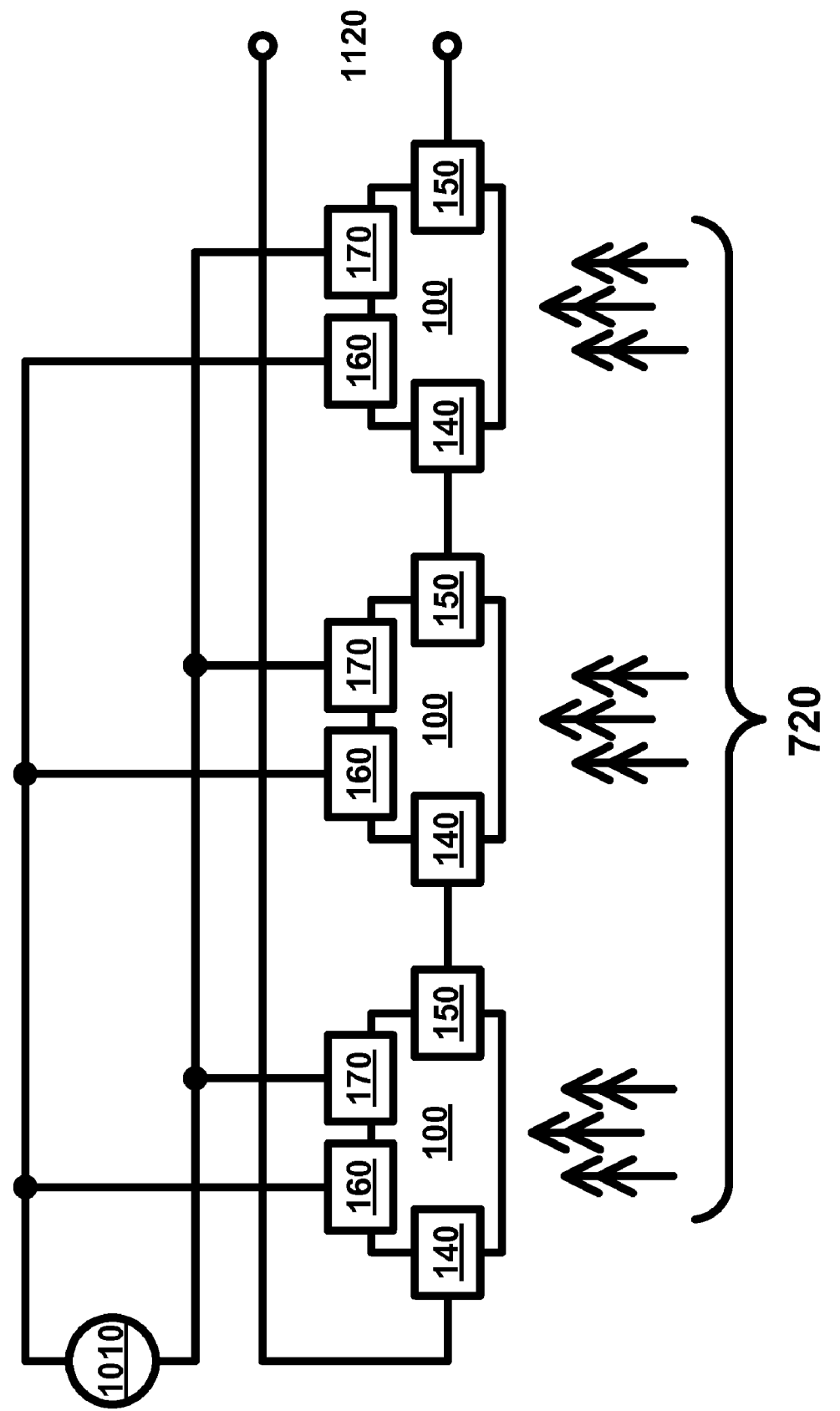
FIG. 11 shows a multitude of nanowire field effect junction diodes 100 connected in series as per an aspect of an embodiment of the present invention.

One skilled in the art will recognize that nanowire field effect junction diodes 100 may be connected in a multitude of configurations to increase voltage output, current output, power output, reliability, etc. For example, FIG. 10 shows a multitude of nanowire field effect junction diodes 100 connected in parallel with a common bias source 1010 to generate additional current output 1020 when exposed to radiation light 720. FIG. 11 shows a multitude of nanowire field effect junction diodes 100 connected in series with a common bias source 1010 to generate additional voltage output 1120 when exposed to radiation light 720. Additional configurations could be implemented to produce logical functionality.

Simulations methods for example nanowire field effect junction diodes 100 will now be discussed. One skilled in the art will recognize that the following simulations were conducted on example embodiments of the present invention with specific configurations to ascertain general characteristics of nanowire field effect junction diodes. It is envisioned that other configurations will be practiced and that each specific configuration will yield independent results. The device characteristics for example nanowire field effect junction diodes 100 were analyzed by using a commercial available TCAD tool Synopsys Sentaurus Device available from Synopsys, Inc. of Mountain View, Calif. The physical models employed in the simulation include the doping-independent Shockley-Read-Hall (SRH) and Auger recombination, delAlamo bandgap narrowing and doping- and field-dependent mobility models. In the device simulation, the workfunction difference ($\Phi_{ms}$) between the gate and the SiNW is set to be zero and the default carrier lifetime ($\tau_{e,h}$) is used (electron: 10 μs, hole: 3 μs), unless otherwise specified. The transfer matrix method was used to apply one-sun illumination (AM1.5 spectrum) to the device. (See Terrestrial Photovoltaic Measurement Procedures. Report ERDA/NASA 1977. p. 1022-77).

Figure 13A:
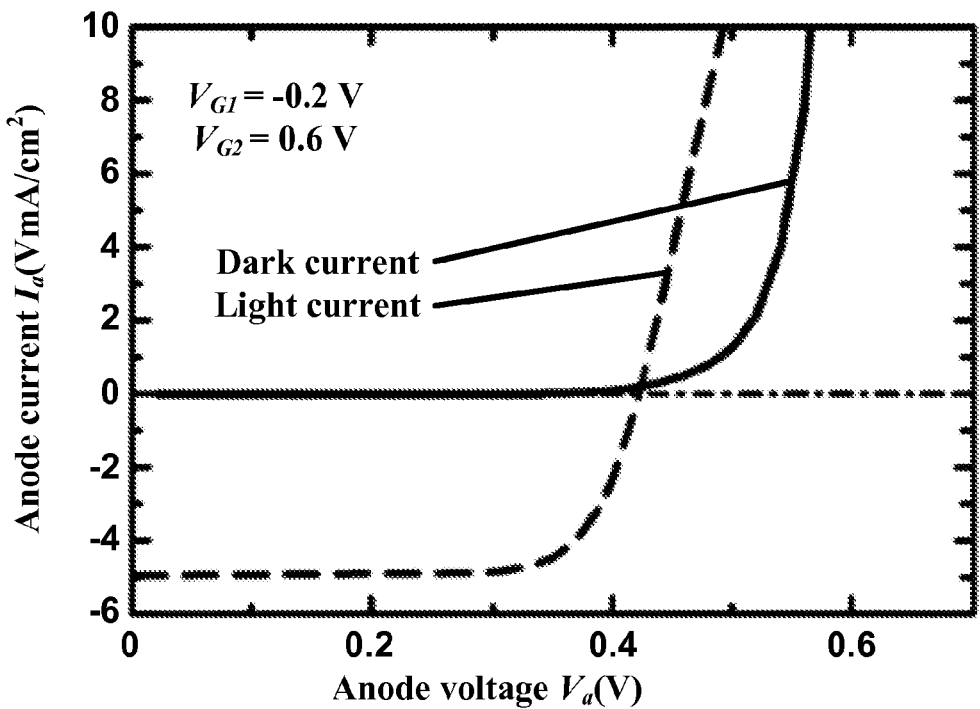
FIG. 13A is a graph showing device characteristics both in dark an under illumination at different gate voltages $V_{G1}=-0.2$ V $V_{G2}=0.6$ V as per an aspect of an embodiment of the present invention.
Figure 13B:
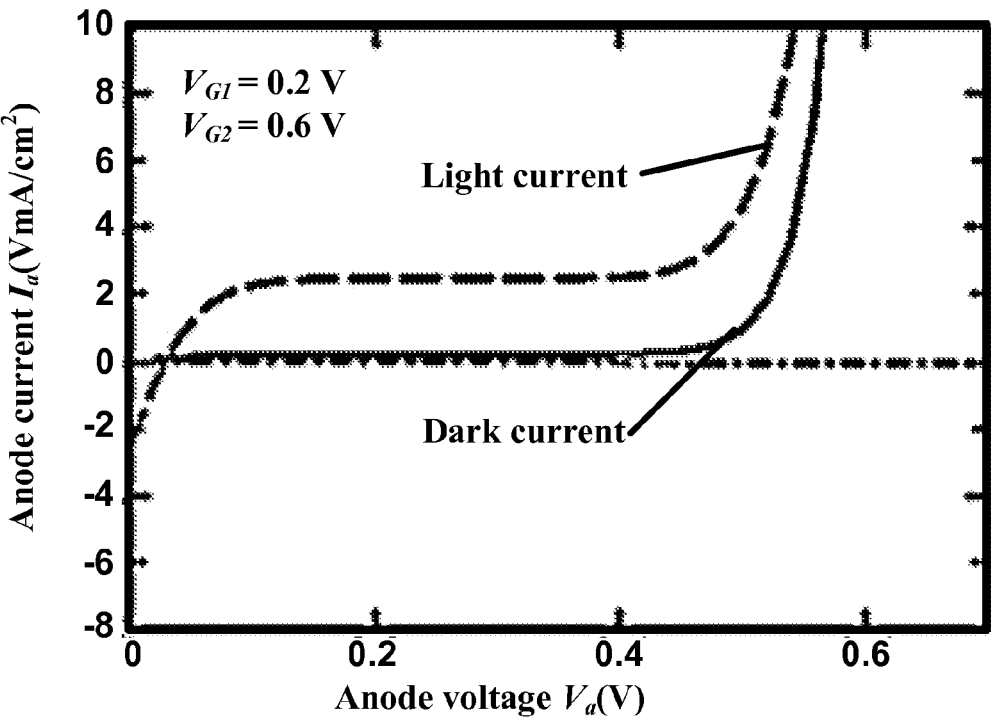
FIG. 13B is a graph showing device characteristics both in dark an under illumination at different gate voltages $V_{G1}=0.2$ V $V_{G2}=-0.6$ V as per an aspect of an embodiment of the present invention.
Figure 14A:
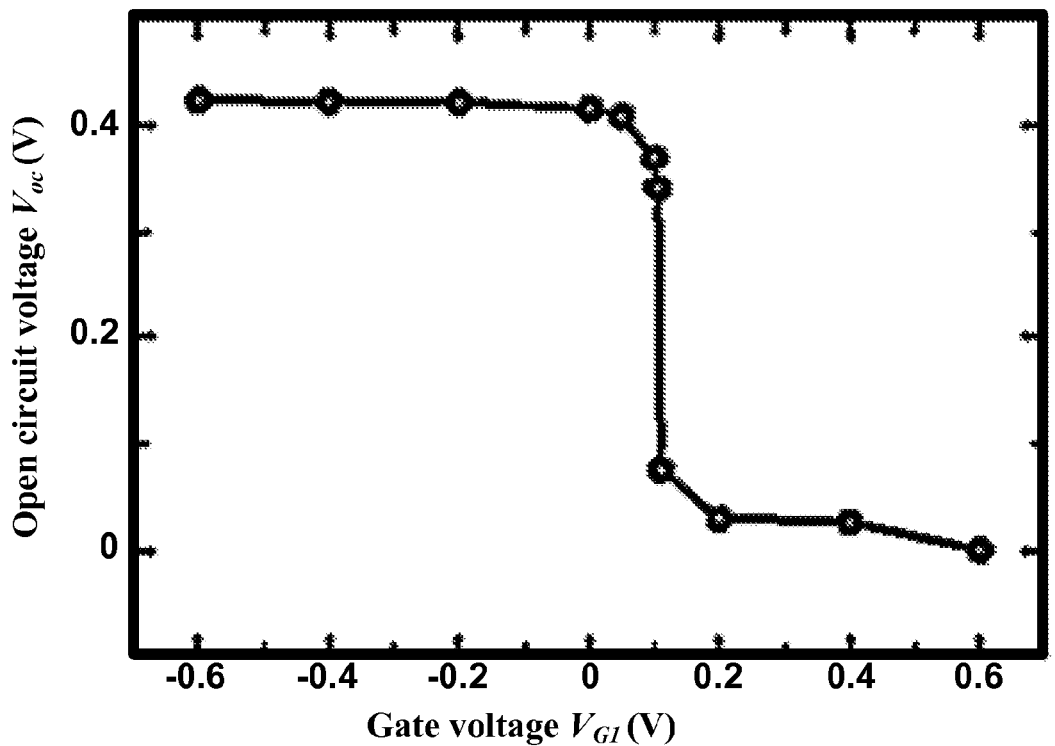
FIG. 14A is a graph showing the dependence of $V_{oc}$ on the gate voltage varying $V_{G1}$ at constant $V_{G2}=0.6$ V as per an aspect of an embodiment of the present invention.
Figure 14B:
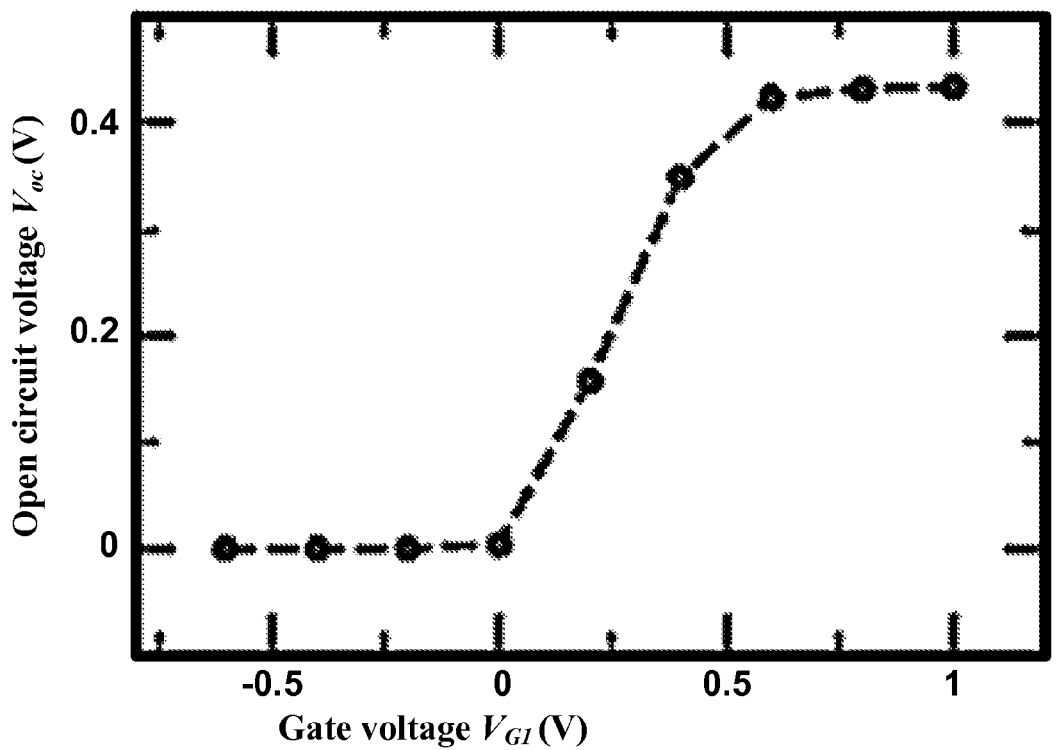
FIG. 14B is a graph showing the dependence of $V_{oc}$ on the gate voltage varying $V_{G2}$ at constant $V_{G1}=-0.6$ V as per an aspect of an embodiment of the present invention.

Results and Discussions of the example simulations will now be discussed starting with the dependence of $V_{oc}$ on gate voltages $V_{G1}$ and $V_{G2}$. Increasing the difference between the two gate voltages $V_{G2}$-$V_{G1}$ increased the built-in potential, leading to a larger open circuit voltage ($V_{oc}$). The IV characteristics both in dark and under illumination are shown in FIGS. 13A and B. Specifically, FIG. 13A shows device characteristics both in dark an under illumination at gate voltages of $V_{G1}$=−0.2 V and $V_{G2}$=0.6 V and FIG. 13B shows device characteristics both in dark an under illumination at gate voltages of $V_{G1}$=0.2 V $V_{G2}$=0.6 V. The effect of gate voltage on $V_{oc}$ is clear. FIGS. 14A and 14B summarizes the dependence of $V_{oc}$ on both $V_{G1}$ and $V_{G2}$ with the other gate voltage fixed. Specifically, FIG. 14A shows the dependence of $V_{oc}$ on the gate voltage varying $V_{G1}$ at constant $V_{G2}$=0.6 V and FIG. 14B shows the dependence of $V_{oc}$ on the gate voltage varying $V_{G2}$ with a constant $V_{G1}$=−0.6 V. As the difference between the two gate voltages $V_{G2}$-$V_{G1}$ is raised from 0 to 1.2 V, $V_{oc}$ increases from 0 V to ~0.43 V. This is due to the increased built-in potential across the induced PN junction as illustrated by the potential cutline extracted at 10 nm below the SiNW/SiO2 interface as shown in FIG. 12.

Figure 15A:
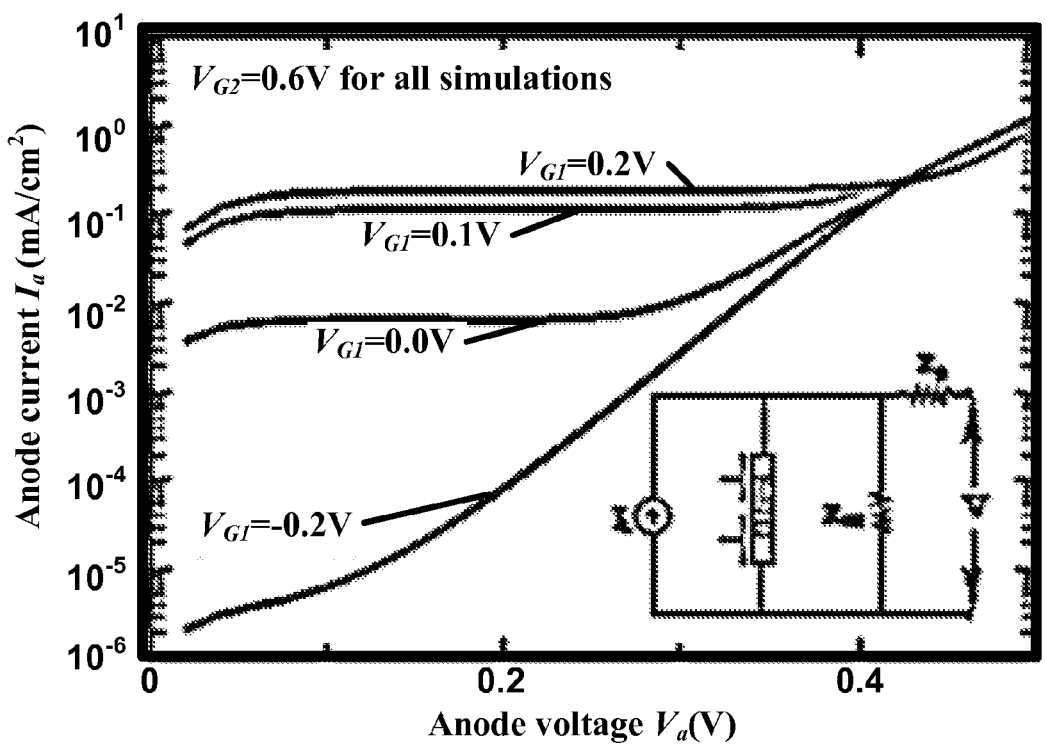
FIG. 15A is a graph showing dark current of the diode versus anode voltage $V_a$ at various gate bias $V_{G1}$ as per an aspect of an embodiment of the present invention.
Figure 15B:
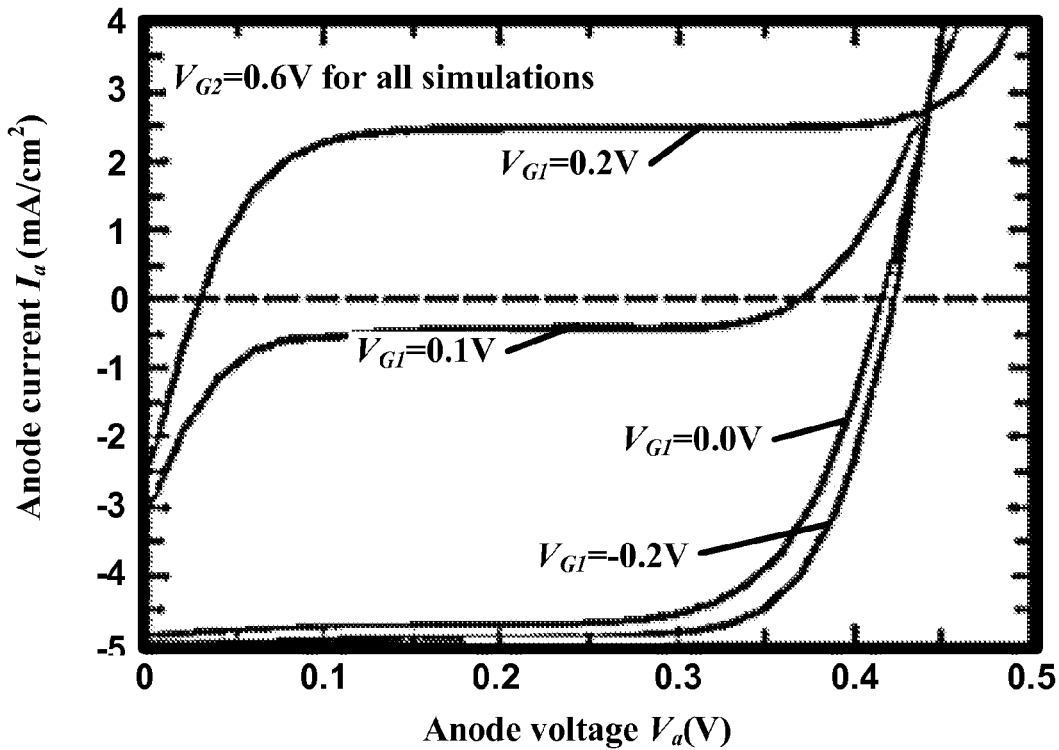
FIG. 15B is a graph showing output current of the diode under illumination versus output voltage $V_{out}$ at various gate bias $V_{G1}$ as per an aspect of an embodiment of the present invention.
Figure 16A:
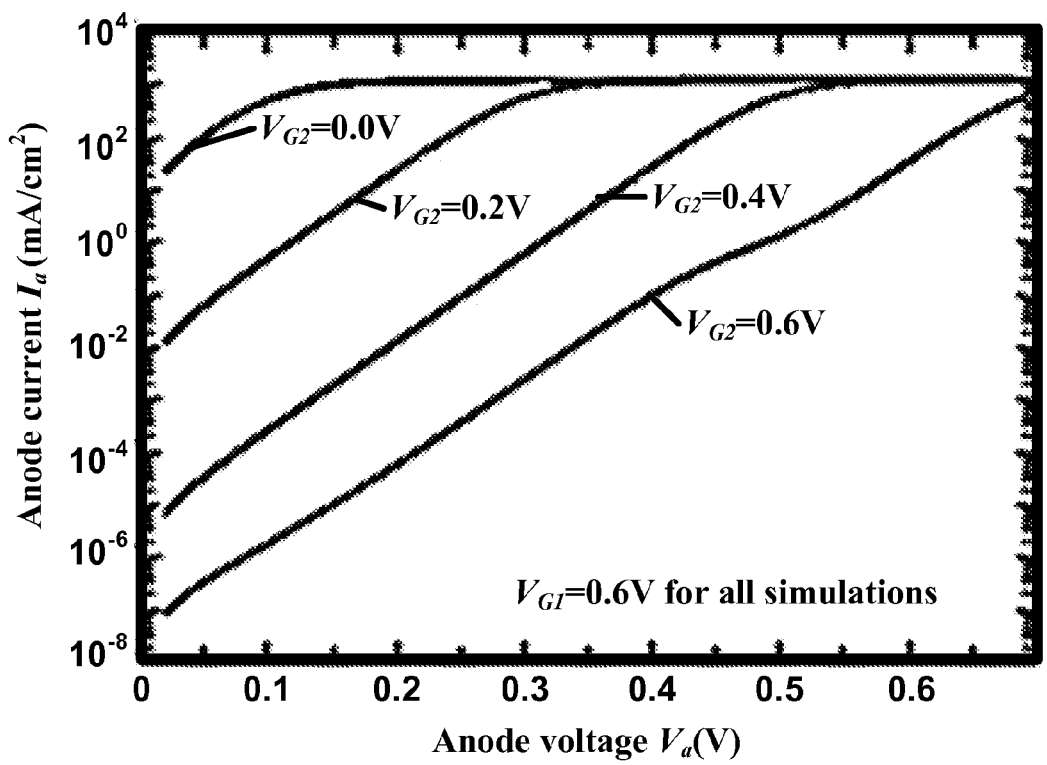
FIG. 16A is a graph showing dark current of the diode versus anode voltage $V_a$ at various gate bias $V_{G2}$ as per an aspect of an embodiment of the present invention.
Figure 16B:
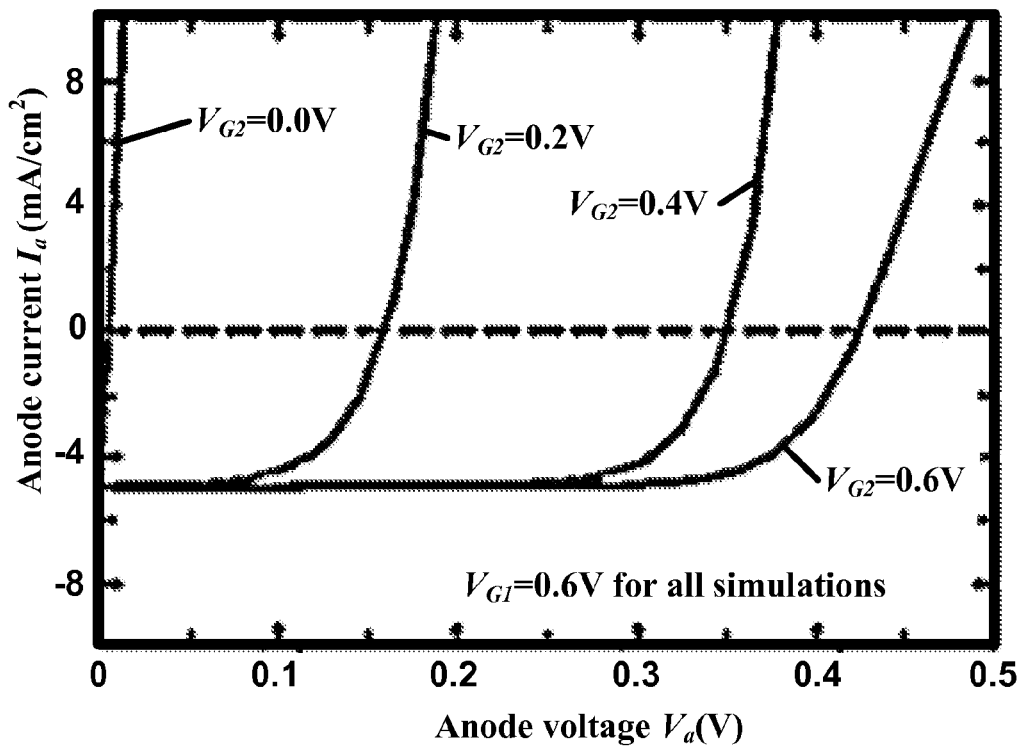
FIG. 16B is a graph showing output current of the diode under illumination versus output voltage $V_{out}$ at various gate bias $V_{G2}$ as per an aspect of an embodiment of the present invention.

Comparing FIG. 14A and FIG. 14B, it is noticed that the curve with constant $V_{G2}$ shows a much transition in the open circuit voltage $V_{oc}$ at $V_{G1}$=0.1 V. This can be understood by comparing the dark and illuminated IV characteristics for both cases, as shown in FIGS. 15A, 15B, 16A and 16B. Specifically: FIG. 15A shows the dark current of the diode versus anode voltage $V_a$ at various gate bias $V_{G1}$; FIG. 15B shows the output current of the diode under illumination versus output voltage $V_{out}$ at various gate bias $V_{G1}$; FIG. 16A shows the dark current of the diode versus anode voltage $V_a$ at various gate bias $V_{G2}$; and FIG. 16B shows the output current of the diode under illumination versus output voltage $V_{out}$ at various gate bias $V_{G2}$.

It is seen in FIG. 15A that the anode current $I_a$ at a small anode voltage $V_a$ (<0.4 V) increases by several orders of magnitude as $V_{G1}$ increases from −0.2 V to 0.1 V. When $V_{G1}$ is positive, the channel under G1 is inverted to n-type region (electrons are attracted to the dielectric/Si interface), the anode and the region under G2 serve as the drain and source of the NMOS. Similar to a conventional NMOS, the current first increases with $V_a$ and eventually saturated (see FIG. 15B, $V_{G1}$=0.1 V). Therefore for larger $V_{G1}$, the current of the device increases dramatically due to the conduction of the NMOS. As $V_a$ further increases, the device is controlled more by $V_a$ and the $I_a$ starts to increase. As the device characteristics under illumination are the dark characteristics shifted down into the fourth quadrant by the amount of light-generated current, the device with larger dark current (with large $V_{G1}$) will have a smaller $V_{oc}$. Because of the flat region in the IV characteristics, $V_{oc}$ reduces with $V_{G1}$ slowly at first and then suddenly drop within a small voltage range. In contrast, if $V_{G1}$ is kept constant, the device behaves like a normal PN diode as the region under G1 is always accumulated with holes. Therefore the flat region in the IV characteristics does not exist in this case, as shown in FIG. 16A and FIG. 16B. This results in the smooth change in $V_{oc}$ as $V_{G1}$ changes.

Figure 17A:
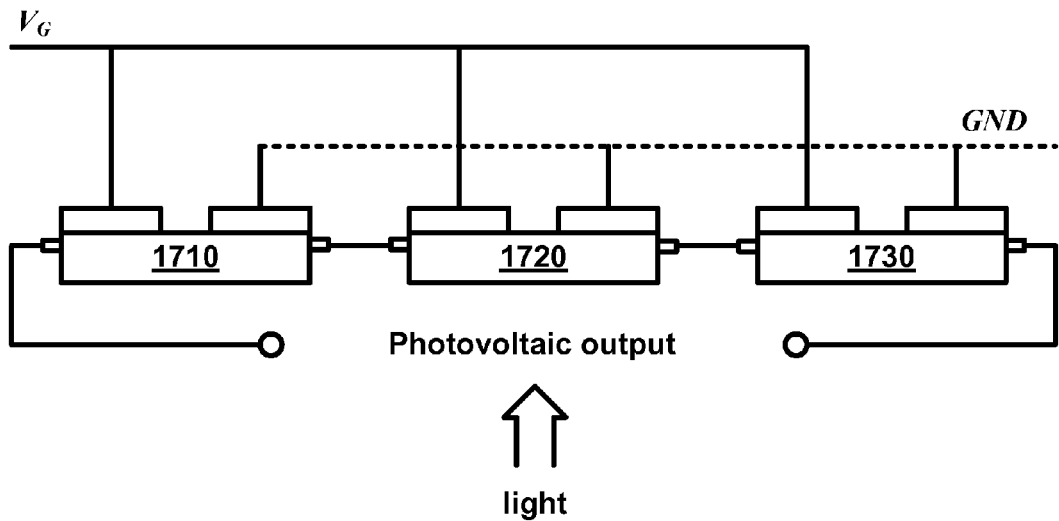
FIG. 17A is a diagram showing three SiNW field effect junction diodes connected in series as per an aspect of an embodiment of the present invention.
Figure 17B:
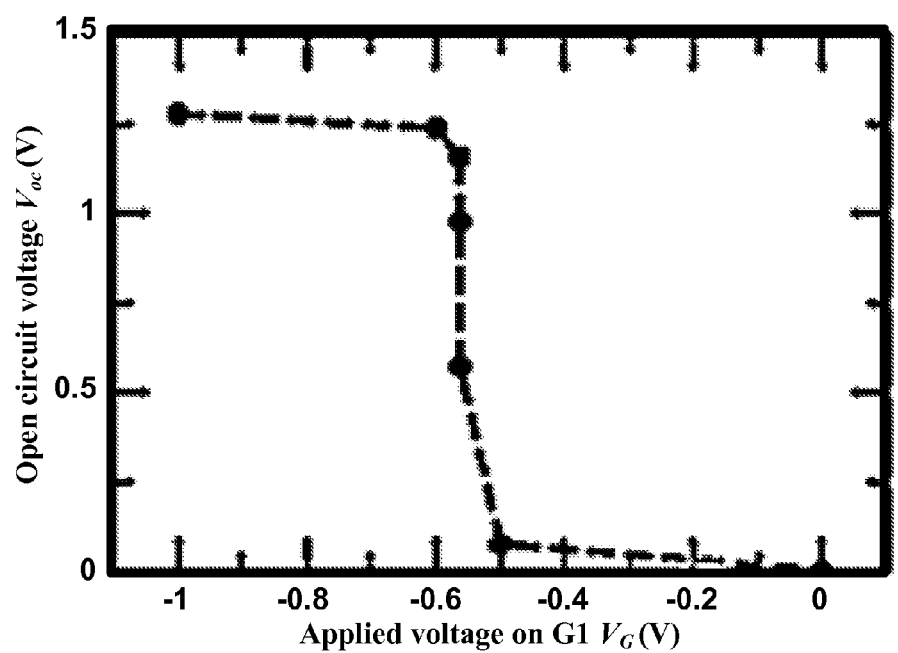
FIG. 17B is a graph showing open circuit voltage $V_{oc}$ of the series circuit in FIG. 17A as a function of voltage bias $V_G$ on Gate 1 as per an aspect of an embodiment of the present invention.

Large Open-Circuit Voltage with FED connected in series will now be discussed. FIG. 17A is a diagram showing three SiNW FEDs (1710, 1720 and 1730) connected in series and FIG. 17B is a graph shows the dependence of $V_{oc}$ on the applied gate voltage $V_G$ of the whole circuit consisted of three field effect diodes (1710, 1720 and 1730) connected in series. Large $V_{oc}$ can be achieved with this design. For a single FED to produce power from light, $V_{G1}$ of the FED has to be more negative than the cathode voltage $V_c$ while $V_{G2}$ should be more positive than $V_c$ which is the reference voltage of the device. To output more power, several FEDs can be connected together in series. As several FEDs are cascaded in series, the output voltage of one FED will raise the reference voltage of the cells in the following stages. This means that larger voltages have to be applied to the G1 of the following cells, which is impractical. Here, the proper gate electrode workfunction and the connection shown in the inset of FIG. 17A is used so that the voltage $V_G$ applied on G1 of the first two FEDs (1710 and 1720) can control the output voltage $V_{oc}$ of the whole circuit. N-poly is used as the electrode of both gates G1 and G2. G2 of each cell is connected to its own cathode. Because the nanowire is almost intrinsic, the workfunction difference $|\Phi_{ms}|$ between gate electrode and SiNW acts as an equivalent positive gate bias which raises the potential of the SiNW underneath and attracts electrons. G1 of cell n+1 is connected to the cathode of the cell n−1. In the example here, if $V_G$ on the first two cells C1 (1710) and C2 (1720) is large enough, i.e. −1.0V, $V_2$ will be ~0.86V under illumination. Since $V_{G1,C3}$=0 V, the effective bias on the channel under G1 of C3 (1730) is around $|\Phi_{ms}|-V_2 \approx -0.2$ V (with the reference to $V_2$). As a result, $V_{oc}$ of cell C3 (1730) can be 0.43V, the same as cells C2 (1720) and C1 (1710). Increasing $V_G$ will reduce $V_{oc}$ of the first two cells and consequently increase the equivalent gate bias $V_{G1}$ on cell C3 (1730), and thereby reduce the output voltage of the whole circuit. In this way, FEDs can be cascaded in series for larger output voltage and its value can be controlled by $V_G$ applied to G1 of the two cells, as demonstrated by FIG. 17B.

Figure 18:
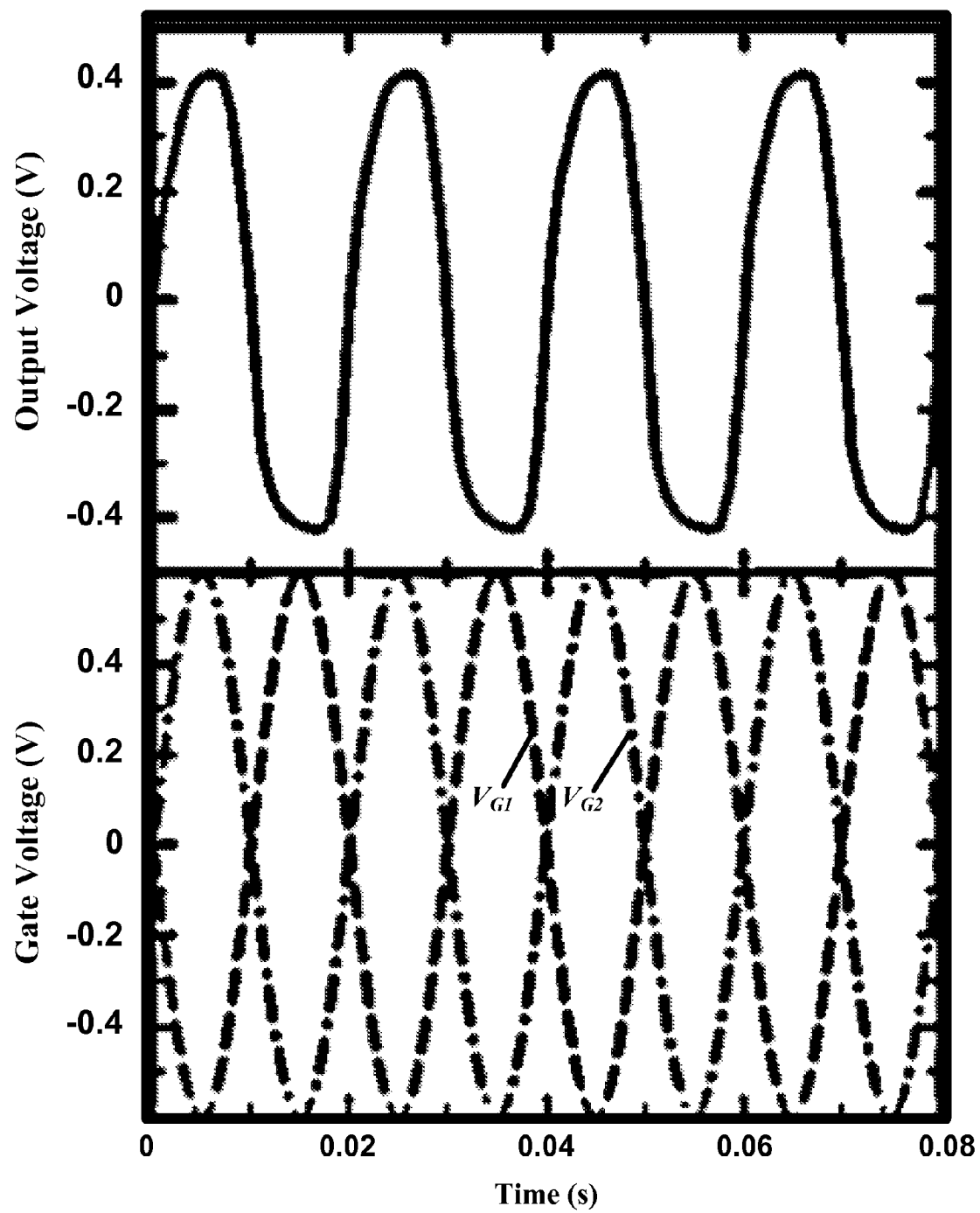
FIG. 18 is a graph showing AC response of a single nanowire field effect junction diode under two sinusoidal gate voltages which are 180° out of phase as per an aspect of an embodiment of the present invention.

AC power generation by a single FED will now be discussed. AC power can be generated by flipping G1 and G2 of a single FED under constant sunlight. FIG. 18 is a graph showing AC response of a single FED under two sinusoidal gate voltages which are 180° out of phase. As shown in FIG. 18, by applying two sinusoidal gate voltages which are at 50 Hz and 180° out of phase between each other, a 50 Hz sinusoidal output voltage is achieved. This AC output with constant light is interesting for application in power supply, as the conventional photovoltaic solar cells only generate DC power.

A novel optical sensor that detects light by the polarization of voltage and current will now be discussed. The conventional optical sensors detect the light by the magnitude response of voltage or current. With FEDs, light can be detected by the polarization of output voltage and current which can be achieved by flipping the voltage of the two gates. The detection of light can be much more sensitive and simpler by just measuring the voltage and current polarization.

Figure 19:
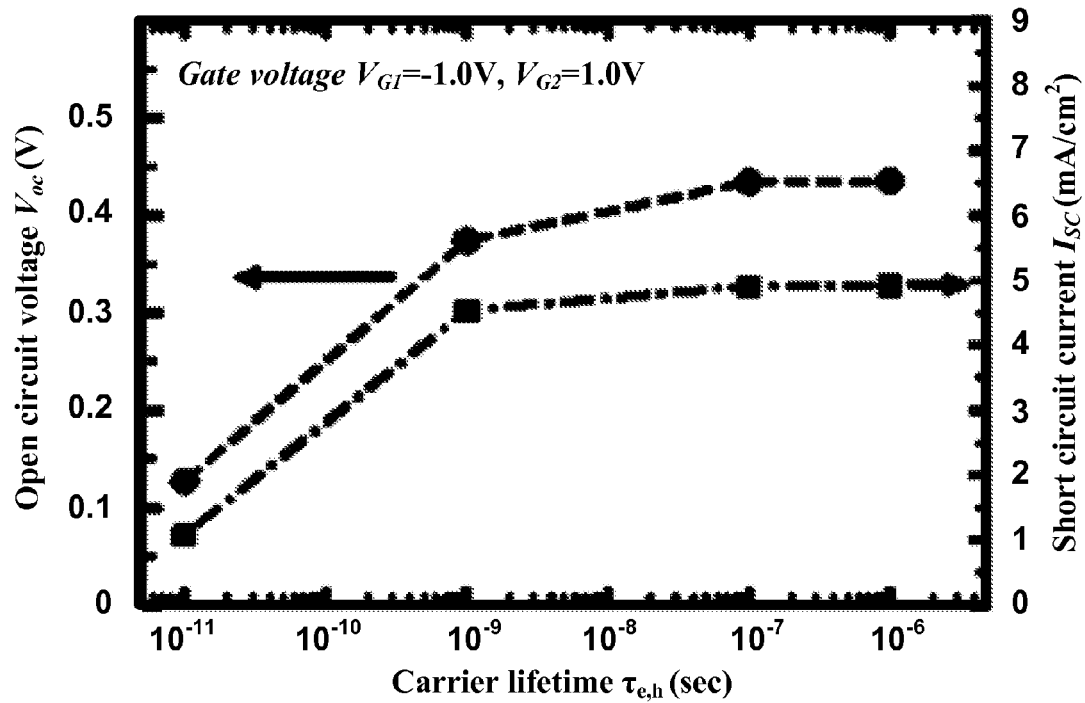
FIG. 19 is a graph showing open circuit voltage $V_{oc}$ and short circuit current $I_{sc}$ versus carrier lifetime at constant gate bias as per an aspect of an embodiment of the present invention.

Device design issues will now be discussed. As only the light-generated electron-hole pairs within a minority carrier diffusion length on either side may be collected by the PN junction and therefore contribute to output current, carrier lifetime plays an important role in determining the performance of solar cells as it determines the diffusion length of carriers. FIG. 19 is a graph showing open circuit voltage $V_{oc}$ and short circuit current $I_{sc}$ versus carrier lifetime at constant gate bias and shows the degradation $V_{oc}$ and $I_{sc}$ as the carrier lifetime is reduced. It is reported recently that the measured hole life time in a SiNW-based solar cell is approximately 15 ns. (See Kelzenberg, M. D., et al., *Photovoltaic Measurements in Single-Nanowire Silicon Solar Cells*. 2008. p. 710-714). With this carrier lifetime, $V_{oc}$ of the simulated device can still be ~0.4 V. Both $V_{oc}$ and $I_{sc}$ are not quite sensitive to $\tau_{e,h}$. For $\tau_{e,h}$=1 µs to 1 ns, $V_{oc}$ only drops from 0.43 V to 0.37 V. This is because the relatively short gate length (1 µm) ensures all the electron-hole pairs created can be collected by the PN junction in the range of carrier lifetime considered here. Further decreasing the carrier lifetime reduces the carrier diffusion length too much and thereby degrading both $V_{oc}$ and $I_{sc}$. It is also seen in FIG. 19 that large carrier life time may not improve the device performance much due to the relatively short gate length.

Figure 20:
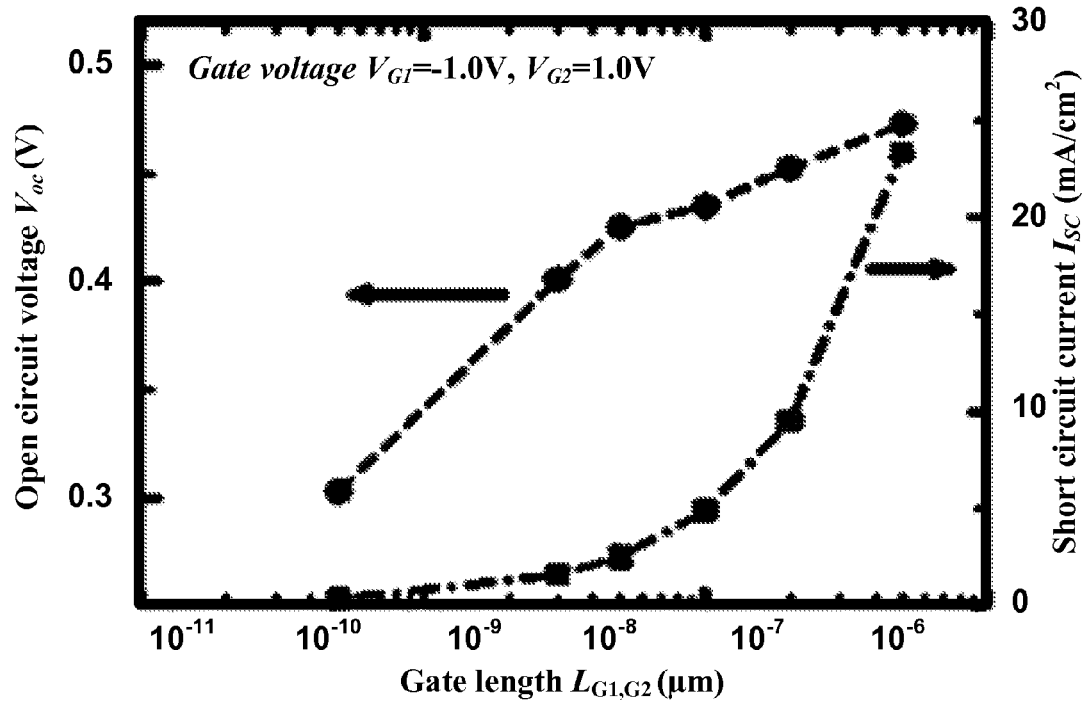
FIG. 20 is a graph showing open circuit voltage $V_{oc}$ and short circuit current $I_{sc}$ as a function of gate length as per an aspect of an embodiment of the present invention.
Figure 21:
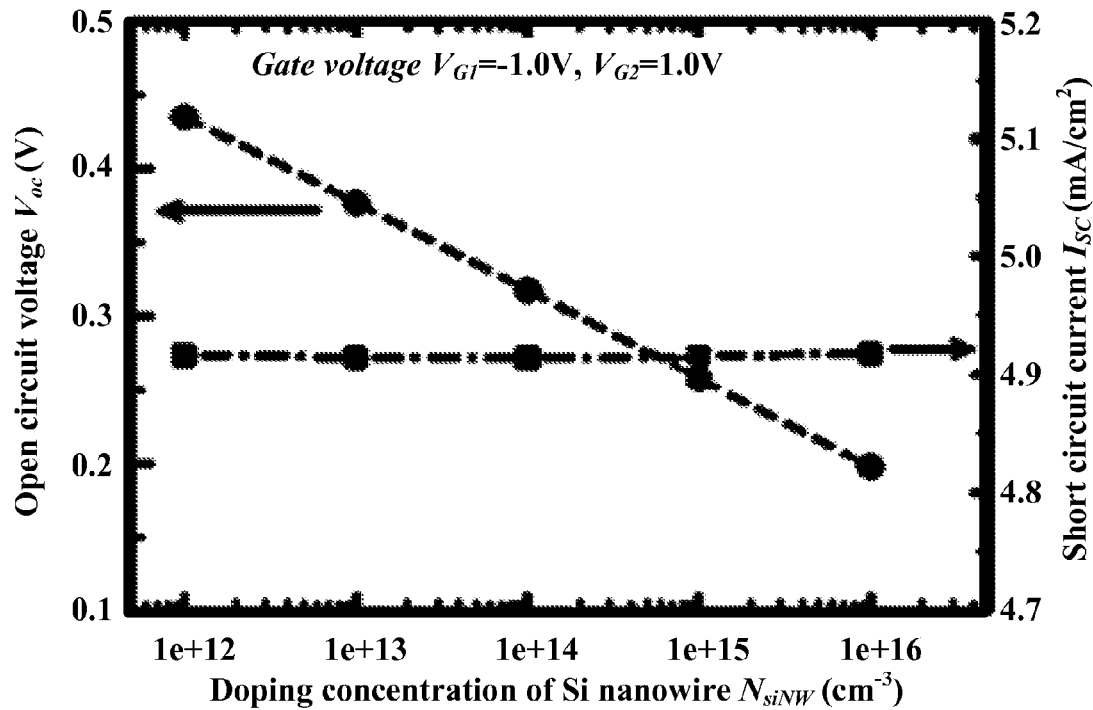
FIG. 21 is a graph showing open circuit voltage $V_{oc}$ and short circuit current $I_{sc}$ as a function of the doping concentration of the SiNW $N_{SiNW}$.
Figure 22:
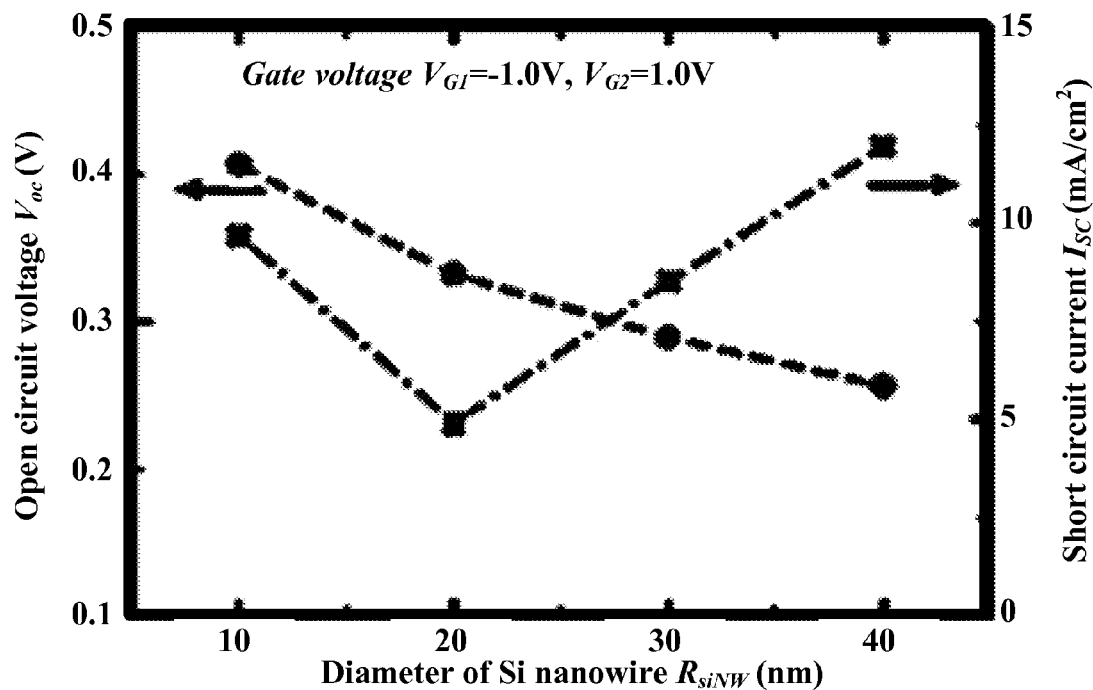
FIG. 22 is a graph showing open circuit voltage $V_{oc}$ and short circuit current $I_{sc}$ as a function of the diameter of the SiNW $t_{SOI}$.
Figure 23:
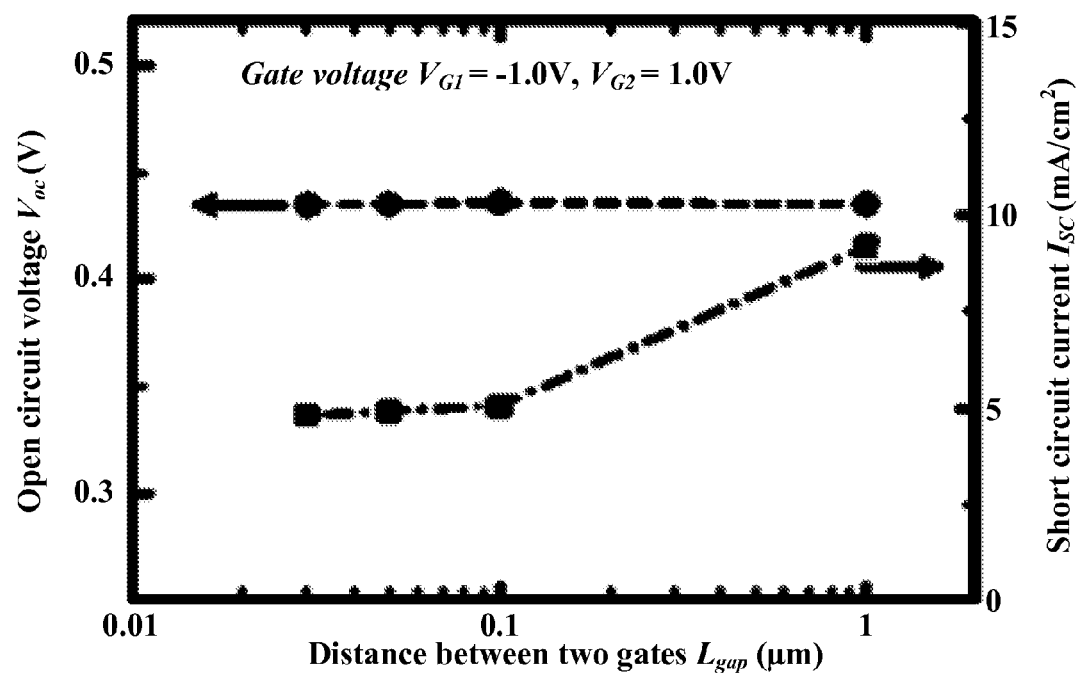
FIG. 23 is a graph showing open circuit voltage $V_{oc}$ and short circuit current $I_{sc}$ as a function of the doping distance between two gates $L_{gap}$.

The effects of several other device parameters are explored and shown in FIGS. 20 through 23. FIG. 20 is a graph showing open circuit voltage $V_{oc}$ and short circuit current $I_{sc}$ as a function of gate length and shows how the gate length affects $V_{oc}$ and $I_{sc}$. As the length of the gate determines how much light is collected, longer nanowire may be preferable for a better device performance. As long as the gate length is shorter than the minority carrier diffusion length, increasing the gate length will increase both $V_{oc}$ and $I_{sc}$. Channel length longer than several carrier diffusion lengths may be less helpful for the improvement of $V_{oc}$ and $I_{sc}$. Due to the large $\tau_{e,h}$ used in the simulation, this is not observed in this example. As the FED relies on the control of gate voltage on the SiNW beneath, both doping and diameter of the nanowire appear to be important parameters as shown in FIG. 21 and FIG. 22 respectively. FIG. 21 is a graph showing open circuit voltage $V_{oc}$ and short circuit current $I_{sc}$ as a function of the doping concentration of the SiNW $N_{SiNW}$ and FIG. 22 is a graph showing open circuit voltage $V_{oc}$ and short circuit current $I_{sc}$ as a function of the diameter of the SiNW $t_{SOI}$. These two figures suggest that large $V_{oc}$ can be obtained for devices with small SiNW diameter and light doping. This allows the temporarily created PN junction to extend deep enough and touch the BOX layer. Better gate control may be expected when the channel is almost surrounded by the gate. FIG. 22 also shows that $I_{sc}$ may not have a monolithic dependence on the SiNW diameter. This might be due to the different transmission properties of the SiNW with different diameters and require optimization for maximum efficiency. Finally, FIG. 23 is a graph showing open circuit voltage $V_{oc}$ and short circuit current $I_{sc}$ as a function of the doping distance between two gates $L_{gap}$ and shows that $V_{oc}$ may depend on the distance between the two gates weakly while increasing $L_{gap}$ can increase $I_{sc}$ which is due to the large photon collection area.

A novel Si-nanowire based FED for photovoltaic applications has been disclosed. It has been shown that: (i) with the induced PN junction between the two gates, the open circuit voltage $V_{oc}$ may be tuned by the applied gate bias; (ii) AC power generation may be achieved with the nanowire FED photovoltaic cell; (iii) large output voltage ranges may be achieved by properly connecting several devices in series; (iv) smaller SiNW and lower doping may result in better control of the induced PN junction; and (v) the carrier lifetime may be a less critical parameter due to the small dimension of the device. Such a nanowire FED photovoltaic device be applied in applications such as light-controlled switches, optical sensors, solar cells, etc.

In this specification, "a" and "an" and similar phrases are to be interpreted as "at least one" and "one or more."

Many of the elements described in the disclosed embodiments may be implemented as modules. A module is defined here as an isolatable element that performs a defined function and has a defined interface to other elements. The modules described in this disclosure may be implemented in hardware, software, firmware, wetware (i.e hardware with a biological element) or a combination thereof, all of which are behaviorally equivalent. For example, modules may be implemented as a software routine written in a computer language (such as C, C++, Fortran, Java, Basic, Matlab or the like) or a modeling/simulation program such as Simulink, Stateflow, GNU Octave, or LabVIEW MathScript. Additionally, it may be possible to implement modules using physical hardware that incorporates discrete or programmable analog, digital and/or quantum hardware. Examples of programmable hardware include: computers, microcontrollers, microprocessors, application-specific integrated circuits (ASICs); field programmable gate arrays (FPGAs); and complex programmable logic devices (CPLDs). Computers, microcontrollers and microprocessors are programmed using languages such as assembly, C, C++ or the like. FPGAs, ASICs and CPLDs are often programmed using hardware description languages (HDL) such as VHSIC hardware description language (VHDL) or Verilog that configure connections between internal hardware modules with lesser functionality on a programmable device. Finally, it needs to be emphasized that the above mentioned technologies are often used in combination to achieve the result of a functional module.

The disclosure of this patent document incorporates material which is subject to copyright protection. The copyright owner has no objection to the facsimile reproduction by anyone of the patent document or the patent disclosure, as it appears in the Patent and Trademark Office patent file or records, for the limited purposes required by law, but otherwise reserves all copyright rights whatsoever.

While various embodiments have been described above, it should be understood that they have been presented by way of example, and not limitation. It will be apparent to persons skilled in the relevant art(s) that various changes in form and detail can be made therein without departing from the spirit and scope. In fact, after reading the above description, it will be apparent to one skilled in the relevant art(s) how to implement alternative embodiments. Thus, the present embodiments should not be limited by any of the above described exemplary embodiments. In particular, it should be noted that, for example purposes, the above explanation has focused on the example(s) light or radiation applications. However, one skilled in the art will recognize that embodiments of the invention could also be used in applications such as logic or memory devices.

In addition, it should be understood that any figures which highlight the functionality and advantages, are presented for example purposes only. The disclosed architecture is sufficiently flexible and configurable, such that it may be utilized in ways other than that shown. For example, the steps listed in any flowchart may be re-ordered or only optionally used in some embodiments.

Further, the purpose of the Abstract of the Disclosure is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The Abstract of the Disclosure is not intended to be limiting as to the scope in any way.

Finally, it is the applicant's intent that only claims that include the express language "means for" or "step for" be interpreted under 35 U.S.C. 112, paragraph 6. Claims that do not expressly include the phrase "means for" or "step for" are not to be interpreted under 35 U.S.C. 112, paragraph 6.

What is claimed is:

1. A nanowire field effect junction diode comprising:
   a. an electrically insulating transparent substrate;
   b. a nanowire disposed on the electrically insulating transparent substrate;
   c. an anode contacting a first end of the nanowire;
   d. a cathode contacting a second end of the nanowire;
   e. an oxide layer covering the nanowire;
   f. a first conducting gate:
      i. disposed on top of the oxide layer; and
      ii. adjacent with a non-zero separation to the anode; and
   g. a second conducting gate:
      i. disposed on top of the oxide layer;
      ii. adjacent with a non-zero separation to the cathode; and
      iii. adjacent with a non-zero separation the first conducting gate.

2. A nanowire field effect junction diode according to claim 1, wherein the nanowire field effect junction diode is configured to allow activating electromagnetic radiation to pass through the electrically insulating transparent substrate.

3. A nanowire field effect junction diode according to claim 2, wherein at least some of the activating electromagnetic radiation is in the visual spectrum.

4. A nanowire field effect junction diode according to claim 2, wherein at least some of the activating electromagnetic radiation is at least one of the following:
   a. X-rays;
   b. ultraviolet radiation; or
   c. infrared radiation.

5. A nanowire field effect junction diode according to claim 2, wherein the electrically insulating transparent substrate is a transparent insulating glass.

6. A nanowire field effect junction diode according to claim 1, wherein the first conducting gate and second conducting gate are configured to be biased with a bias voltage.

7. A nanowire field effect junction diode according to claim 6, wherein the bias voltage is a direct current voltage.

8. A nanowire field effect junction diode according to claim 6, wherein the bias voltage is an alternating current voltage.

9. A nanowire field effect junction diode according to claim 1, wherein the nanowire is between 1 nm to 50 nm in diameter.

10. A nanowire field effect junction diode according to claim 1, wherein the nanowire is a semiconducting nanowire.

11. A nanowire field effect junction diode according to claim 1, wherein at least part of the nanowire includes at least one of the following:
    a. Si;
    b. SiC;
    c. InP;
    d. GaN; or
    e. GaAs.

12. A nanowire field effect junction diode according to claim 1, wherein:
    a. the nanowire field effect junction diode is configured to allow activating electromagnetic radiation to pass through the electrically insulating transparent substrate;
    b. the first conducting gate and second conducting gate are configured to be biased with a bias voltage;
    c. the anode is configured to connect to a first terminal of a circuit; and
    d. the cathode is configured to connect to a second terminal of the circuit.

13. A nanowire field effect junction diode according to claim 12, wherein the circuit is configured to react to changes in the activating electromagnetic radiation as indicated by a voltage across the anode and cathode.

14. A nanowire field effect junction diode according to claim 12, wherein the circuit is configured to react to changes in activating electromagnetic radiation as indicated by a current passing through the anode and cathode.

15. A nanowire field effect junction diode according to claim 12, wherein the circuit is configured to react to changes in activating electromagnetic radiation by:
   a. flipping the bias voltage across the first conducting gate and second conducting gate;
   b. analyzing the polarization of the voltage and current at the anode and cathode.

16. A nanowire field effect junction diode according to claim 12, wherein:
   a. the bias voltage is a direct current voltage;
   b. the circuit is configured to indicate changes in intensity of the activating electromagnetic radiation by reacting to changes in the amplitude of a voltage across the anode and cathode.

17. A nanowire field effect junction diode according to claim 12, wherein:
   a. the bias voltage is an alternating voltage;
   b. the circuit is configured to indicate changes in intensity of the activating electromagnetic radiation by reacting to changes in the polarity of the voltage across the anode and cathode.

18. A nanowire field effect junction diode according to claim 1, wherein the nanowire field effect junction diode is connected in series with at least one other nanowire field effect junction diode.

19. A nanowire field effect junction diode according to claim 1, wherein the nanowire field effect junction diode is connected in parallel with at least one other nanowire field effect junction diode.

20. A nanowire field effect junction diode according to claim 1, wherein:
   a. the nanowire field effect junction diode is configured to allow activating electromagnetic radiation to pass through the electrically insulating transparent substrate;
   b. the first conducting gate and second conducting gate are configured to be biased with a DC bias voltage;
   c. the anode is connected to a first power terminal; and
   d. the cathode is connected to a second power terminal.

21. A nanowire field effect junction diode according to claim 1, wherein:
   a. the nanowire field effect junction diode is configured to allow activating electromagnetic radiation to pass through the electrically insulating transparent substrate;
   b. the first conducting gate and second conducting gate are configured to be biased with an AC bias voltage;
   c. the anode is connected to a first power terminal; and
   d. the cathode is connected to a second power terminal.

* * * * *